(12) United States Patent
Kim et al.

(10) Patent No.: US 11,955,470 B2
(45) Date of Patent: Apr. 9, 2024

(54) SEMICONDUCTOR DEVICE AND ELECTRONIC SYSTEM

(71) Applicant: Samsung Electronics Co., Ltd., Suwon-si (KR)

(72) Inventors: Jiwon Kim, Seoul (KR); Jaeho Ahn, Seoul (KR); Sungmin Hwang, Hwaseong-si (KR); Joonsung Lim, Seongnam-si (KR); Sukkang Sung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 332 days.

(21) Appl. No.: 17/229,062

(22) Filed: Apr. 13, 2021

(65) Prior Publication Data

US 2022/0102334 A1 Mar. 31, 2022

(30) Foreign Application Priority Data

Sep. 28, 2020 (KR) .................. 10-2020-0126370

(51) Int. Cl.
*H01L 23/00* (2006.01)
*H01L 25/18* (2023.01)
(Continued)

(52) U.S. Cl.
CPC .............. *H01L 25/18* (2013.01); *H01L 24/08* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/40* (2023.02);
(Continued)

(58) Field of Classification Search
CPC ........ H10B 41/10; H10B 41/27; H10B 41/35; H10B 41/40; H10B 43/10; H10B 43/27; H10B 43/35; H10B 43/40; H10B 43/50
See application file for complete search history.

(56) References Cited

U.S. PATENT DOCUMENTS 10,211,166 B2   2/2019  Matsuo
10,283,493 B1   5/2019  Nishida
(Continued)

FOREIGN PATENT DOCUMENTS

JP      2018-163970 A    10/2018
KR   10-2020-0037894 A    4/2020

OTHER PUBLICATIONS

Extended European Search Report dated Feb. 24, 2022 issued in corresponding European Patent Application No. 21182399.2-1212.

*Primary Examiner* — Elias Ullah
(74) *Attorney, Agent, or Firm* — HARNESS, DICKEY & PIERCE, P.L.C.

(57) ABSTRACT

A semiconductor device includes a first peripheral circuit region comprising a plurality of lower circuitries, a second peripheral circuit region apart from the first peripheral circuit region in a vertical direction, the second peripheral circuit region comprising a plurality of upper circuitries, and a cell region comprising a plurality of word lines, the cell region between the first peripheral circuit region and the second peripheral circuit region in the vertical direction. The plurality of word lines comprise a first word line connected to a first lower circuitry selected from the plurality of lower circuitries and a second word line connected to a first upper circuitry selected from the plurality of upper circuitries.

20 Claims, 28 Drawing Sheets

(51) Int. Cl.
*H10B 41/10* (2023.01)
*H10B 41/27* (2023.01)
*H10B 41/35* (2023.01)
*H10B 41/40* (2023.01)
*H10B 43/10* (2023.01)
*H10B 43/27* (2023.01)
*H10B 43/35* (2023.01)
*H10B 43/40* (2023.01)

(52) U.S. Cl.
CPC ............... *H01L 2224/08147* (2013.01); *H01L 2924/1431* (2013.01); *H01L 2924/1438* (2013.01)

(56) References Cited

U.S. PATENT DOCUMENTS

| | | | |
|---|---|---|---|
| 10,636,813 B1 | 4/2020 | Xiao | |
| 10,665,581 B1 | 5/2020 | Zhou et al. | |
| 2019/0043836 A1 | 2/2019 | Fastow et al. | |
| 2019/0221557 A1 | 7/2019 | Kim et al. | |
| 2019/0229125 A1 | 7/2019 | Zhou et al. | |
| 2019/0296041 A1 | 9/2019 | Yamasaka et al. | |
| 2020/0098748 A1 | 3/2020 | Xiao et al. | |
| 2020/0098776 A1 | 3/2020 | Sugisaki | |
| 2020/0105721 A1 | 4/2020 | Park | |
| 2021/0202382 A1* | 7/2021 | Okina | H01L 23/5226 |

* cited by examiner

SEMICONDUCTOR DEVICE AND ELECTRONIC SYSTEM

CROSS-REFERENCE TO RELATED APPLICATION

This application claims the benefit of Korean Patent Application No. 10-2020-0126370, filed on Sep. 28, 2020, in the Korean Intellectual Property Office, the disclosure of which is incorporated herein in its entirety by reference.

BACKGROUND

Inventive concepts relate to a semiconductor device and/or an electronic system including the same, and more particularly, to a semiconductor device including a non-volatile vertical memory device and/or an electronic system including the semiconductor device.

An electronic system that is used to store data includes a semiconductor device capable of storing a large amount of data. Accordingly, to increase the data storage capacity of the semiconductor device, a semiconductor device including a vertical memory device including memory cells three-dimensionally arranged has been proposed.

SUMMARY

Inventive concepts provide a semiconductor device having a structure that may be advantageous for high integration density, with a reduction in planar size. The semiconductor device inhibits an increase in an area occupied by a peripheral circuit region and improves a degree of freedom for design for wirings even when a stacked number of word lines and the number of transistors connected to memory cells are increased to improve the integration density of the semiconductor device, which may include memory cells arranged three-dimensionally.

Inventive concepts also provide an electronic system including a semiconductor device having a structure that is advantageous for high integration density and a reduction in planar size. The semiconductor device may not have an increase in an area occupied by a peripheral circuit region and may improve a degree of freedom for design for wirings even when a stacked number of word lines and the number of transistors connected to memory cells are increased to improve the integration density of the semiconductor device, which may include memory cells arranged three-dimensionally.

According to some example embodiments of inventive concepts, there is provided a semiconductor device including a first peripheral circuit region comprising a plurality of lower circuitries, a second peripheral circuit region apart from the first peripheral circuit region in a vertical direction, the second peripheral circuit region comprising a plurality of upper circuitries, and a cell region comprising a plurality of word lines, the cell region between the first peripheral circuit region and the second peripheral circuit region in the vertical direction. The plurality of word lines comprise a first word line connected to a first lower circuitry selected from the plurality of lower circuitries and a second word line connected to a first upper circuitry selected from the plurality of upper circuitries.

According to some example embodiments of inventive concepts, there is provided a semiconductor device including a first peripheral circuit region comprising a first peripheral circuit substrate, a plurality of lower circuitries, and a plurality of lower conductive lines, a cell region comprising a cell substrate on the first peripheral circuit region, a plurality of gate lines on the cell substrate, a plurality of conductive pad regions connected to the plurality of gate lines, and a plurality of first bonding metal pads, and a second peripheral circuit region apart from the first peripheral circuit region with the cell region between the first peripheral circuit and the second peripheral circuit region, the second peripheral circuit region comprising (A) a second peripheral circuit substrate, (B) a plurality of upper circuitries, (C) a plurality of upper conductive lines, and (D) a plurality of second bonding metal pads bonded to the plurality of first bonding metal pads. The plurality of gate lines comprise (A) a first gate line connected to a first lower circuitry selected from the plurality of lower circuitries and (B) a second gate line connected to a first upper circuitry selected from the plurality of upper circuitries.

According to some example embodiments of inventive concepts, there is provided an electronic system including a main substrate, a semiconductor device on the main substrate, and a controller circuitry electrically connected to the semiconductor device on the main substrate. The semiconductor device comprises a first peripheral circuit region comprising a plurality of lower circuitries, a second peripheral circuit region apart from the first peripheral circuit region in a vertical direction, the second peripheral circuit region comprising a plurality of upper circuitries, and a cell region comprising a plurality of word lines, the cell region between the first peripheral circuit region and the second peripheral circuit region in the vertical direction. The plurality of word lines comprise a first word line connected to a first lower circuitry selected from the plurality of lower circuitries and a second word line connected to a first upper circuitry selected from the plurality of upper circuitries.

BRIEF DESCRIPTION OF THE DRAWINGS

Some example embodiments of inventive concepts will be more clearly understood from the following detailed description taken in conjunction with the accompanying drawings in which.

DETAILED DESCRIPTION OF SOME EXAMPLE EMBODIMENTS

Figure 1:
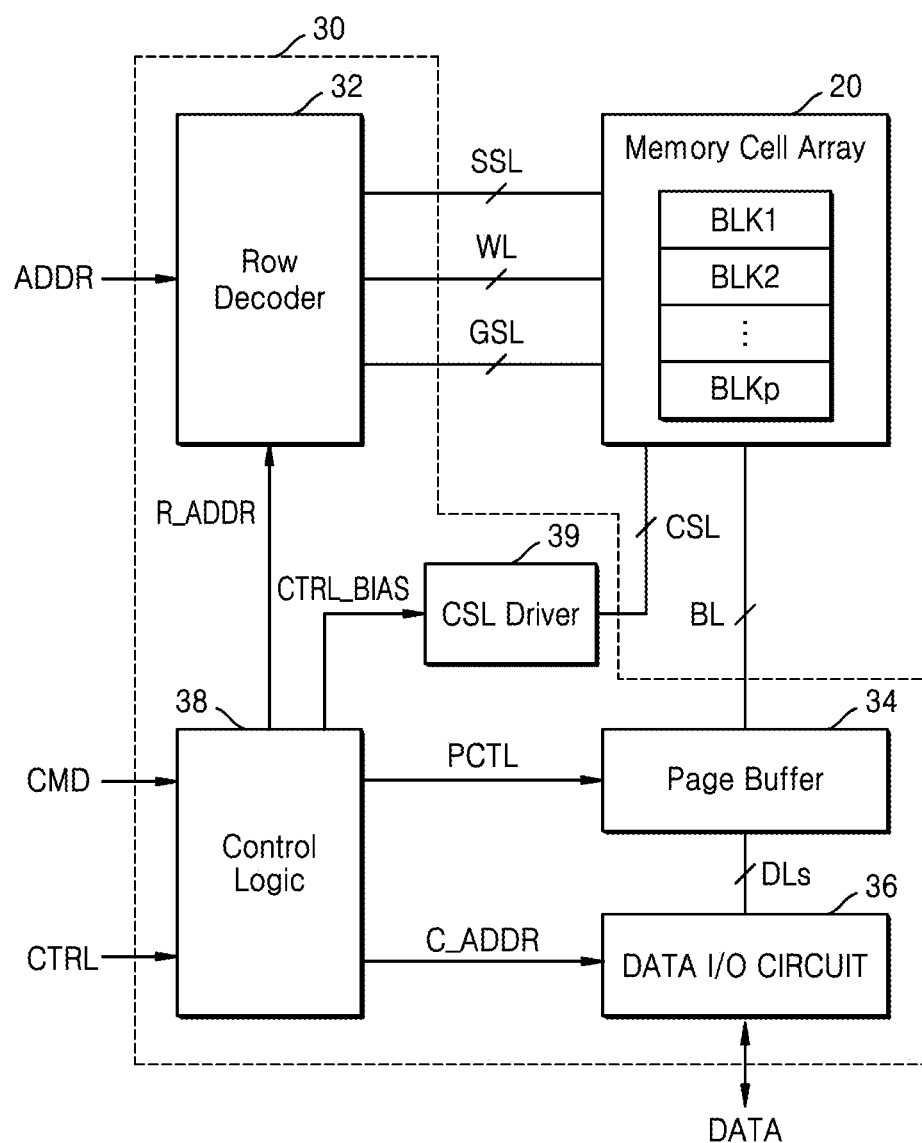
FIG. 1 is a block diagram of a semiconductor device according to some example embodiments.

Hereinafter, some example embodiments will be described in detail with reference to the accompanying drawings. The same reference numerals are used to denote the same elements in the drawings, and repeated descriptions thereof will be omitted.

FIG. 1 is a block diagram of a semiconductor device 10 according to some example embodiments.

Referring to FIG. 1, the semiconductor device 10 may include a memory cell array 20 and a peripheral circuit 30. The memory cell array 20 may include a plurality of memory cell blocks BLK1, BLK2, . . . , and BLKp. Each of the plurality of memory cell blocks BLK1, BLK2, . . . , and BLKp may include a plurality of memory cells. The memory cell blocks BLK1, BLK2, . . . , and BLKp may be connected to the peripheral circuit 30 through a bit line BL, a word line WL, a string selection line SSL, and a ground selection line GSL.

The peripheral circuit 30 may include a row decoder 32, a page buffer 34, a data input/output (I/O) circuit 36, a control logic 38, and a common source line (CSL) driver 39. The peripheral circuit 30 may further include a voltage generation circuit configured to generate various voltages required for/used during operations of the semiconductor device 10, an error correction circuit configured to correct errors in data read from the memory cell array 20, and an I/O interface.

The memory cell array 20 may be connected to the row decoder 32 through the word line WL, the string selection line SSL, and the ground selection line GSL, and may be connected to the page buffer 34 through the bit line BL. In the memory cell array 20, each of the plurality of memory cells included in the plurality of memory cell blocks BLK1, BLK2, . . . , and BLKp may be or may include a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL, which are vertically stacked.

The peripheral circuit 30 may receive an address ADDR, a command CMD, and a control signal CTRL from the outside of the semiconductor device 10, and may transmit and receive data DATA to and/or from a device located outside the semiconductor device 10.

The row decoder 32 may select at least one from the plurality of memory cell blocks BLK1, BLK2, . . . , and BLKp in response to the address ADDR provided from the outside, and select the word line WL, the string selection line SSL, and the ground selection line GSL of the selected memory cell block. The row decoder 32 may transmit a signal, e.g. a voltage for performing a memory operation to the word line WL of the selected memory cell block.

The page buffer 34 may be connected to the memory cell array 20 through the bit line BL. During a program operation, the page buffer 34 may operate as a write driver, and may apply a voltage corresponding to data DATA to be stored in the memory cell array 20 to the bit line BL during a program operation. During a read operation, the page buffer 34 may operate as a sense amplifier, and may sense or sense and amplify the data DATA stored in the memory cell array 20. The page buffer 34 may operate in response to a control signal PCTL provided from the control logic 38.

The data I/O circuit 36 may be connected to the page buffer 34 through a plurality of data lines DLs. During the program operation, the data I/O circuit 36 may receive data DATA from a memory controller (not shown) and may provide program data DATA to the page buffer 34 based on a column address C_ADDR provided from the control logic 38. During the read operation, the data I/O circuit 36 may provide read data DATA stored in the page buffer 34 to the memory controller based on the column address C_ADDR provided from the control logic 38.

The data I/O circuit 36 may transmit an input address ADDR or instruction to the control logic 38 or the row decoder 32. The peripheral circuit 30 may further include an electrostatic discharge (ESD) circuit and a pull-up/pull-down driver, e.g. a driver including a PMOS transistor and an NMOS transistor.

The control logic 38 may receive the command CMD and the control signal CTRL from the memory controller. The control logic 38 may provide a row address R_ADDR to the row decoder 32 and provide a column address C_ADDR to the data I/O circuit 36. The control logic 38 may generate various internal control signals used in the semiconductor device 10 in response to the control signal CTRL. For example, the control logic 38 may adjust voltage levels provided to the word line WL and the bit line BL during the memory operation, such as the program operation and/or the erase operation.

The CSL driver 39 may be connected to the memory cell array 20 through the common source line CSL. The CSL driver 39 may apply a common source voltage (e.g., a power supply voltage) and/or a ground voltage to the common source line CSL via the control of the control logic 38.

In some example embodiments, the peripheral circuit 30 may include a plurality of MOS transistors. The plurality of MOS transistors may be classified according to magnitudes of operating voltages thereof and distributed among a plurality of transistor regions. The operating voltages may correspond to threshold voltages of the transistors. For example, a threshold voltage of a transistor may correspond to a voltage applied to a gate terminal of the transistor that is sufficient to enable current to flow between a source terminal of the transistor and a drain terminal of the transistor.

For example, the peripheral circuit 30 may include or consist of a low-voltage region in which a plurality of low-voltage MOS transistors are formed and a high-voltage region in which a plurality of high-voltage MOS transistors are formed. There may be no high-voltage transistors in the low-voltage region. There may be no low-voltage transistors in the high-voltage reign. The low-voltage MOS transistors may have a threshold voltage lower, e.g. lower in magnitude or absolute value, than the high-voltage MOS transistors. Also, the peripheral circuit 30 may include various regions including a MOS transistor of which an operating voltage (e.g. a threshold voltage) is higher in absolute value than an operating voltage (e.g. a threshold voltage) of the MOS transistor in the low-voltage region and lower in absolute value than an operating voltage of the MOS transistor in the high-voltage region. A value of the threshold voltage of each transistor may be determined, for example, by at least one of a gate length, an implant dose and/or depth of impurities, or an effective oxide thickness of the transistor; however, example embodiments are not limited thereto.

Figure 2:
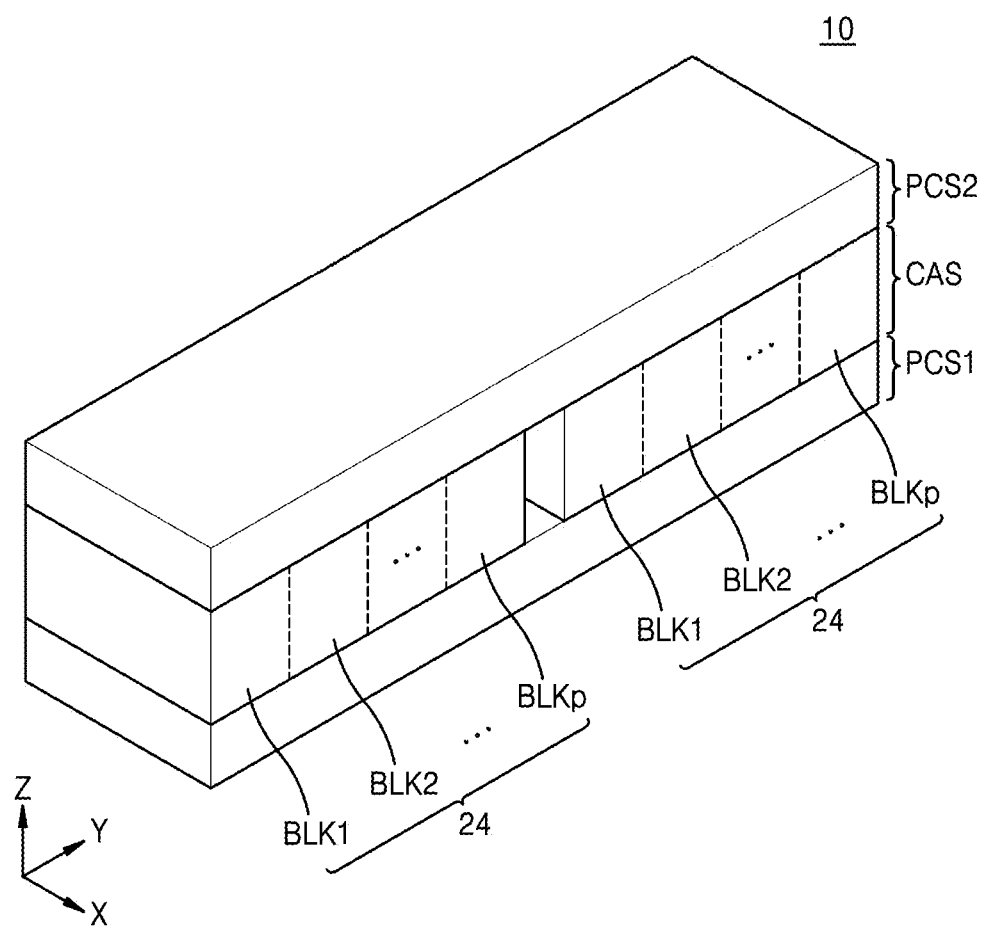
FIG. 2 is a schematic perspective view of a semiconductor device according to some example embodiments.

FIG. 2 is a schematic perspective view of a semiconductor device 10 according to some example embodiments.

Referring to FIG. 2, the semiconductor device 10 may include a first peripheral circuit structure PCS1, a cell array structure CAS, and a second peripheral circuit structure PCS2, which sequentially overlap in a vertical direction (Z direction). The cell array structure CAS may include the memory cell array 20 described with reference to FIG. 1. The first peripheral circuit structure PCS1 and the second peripheral circuit structure PCS2 may be apart from each other in the vertical direction (Z direction) with the cell array structure CAS therebetween. The first peripheral circuit structure PCS1 and the second peripheral circuit structure PCS2 may include the peripheral circuit 30 described with reference to FIG. 1. Various circuits included in the peripheral circuit 30 shown in FIG. 1 may be distributed in the first peripheral circuit structure PCS1 and the second peripheral circuit structure PCS2.

In some example embodiments, circuits included in a row decoder 32 included in the peripheral circuit 30 may be distributed in the first peripheral circuit structure PCS1 and the second peripheral circuit structure PCS2. Alternatively or additionally, in some example embodiments, circuits included in a page buffer 34 included in the peripheral circuit 30 may be distributed in the first peripheral circuit structure PCS1 and the second peripheral circuit structure PCS2.

Alternatively or additionally in some example embodiments, one of the first peripheral circuit structure PCS1 and the second peripheral circuit structure PCS2 may include a low-voltage region in which a plurality of low-voltage MOS transistors, are formed. The other thereof may include a high-voltage region in which a plurality of high-voltage MOS transistors e.g. transistors having a high absolute value of a threshold voltage, are formed. In some example embodiments, each of the first peripheral circuit structure PCS1 and the second peripheral circuit structure PCS2 may include various regions including a MOS transistor of which an operating voltage is higher (in absolute value) than the operating voltage of the MOS transistor in the low-voltage region and lower (in absolute value) than the operating voltage of the MOS transistor in the high-voltage region.

In some example embodiments, the first peripheral circuit structure PCS1 may be connected to the cell array structure CAS through a first connection structure, and the cell array structure CAS may be connected to the second peripheral circuit structure PCS2 through a second connection structure. The first connection structure may provide physical connection and electrical connection between the first peripheral circuit structure PCS1 and the cell array structure CAS. The first connection structure may enable electrical connection and/or data transmission between the first peripheral circuit structure PCS1 and the cell array structure CAS. The second connection structure may provide physical connection and electrical connection between the cell array structure CAS and the second peripheral circuit structure PCS2. The second connection structure may enable electrical connection and/or data transmission between the cell array structure CAS and the second peripheral circuit structure PCS2. Each of the first connection structure and the second connection structure may include a connection unit including a metal-metal bonding structure, a through-silicon via (TSV), a back via stack (BVS), a eutectic bonding structure, a ball grid array (BGA) bonding structure, a plurality of wiring lines, a plurality of contact plugs, or a combination thereof. In some example embodiments, the metal-metal bonding structure may include copper (Cu), aluminum (Al), tungsten (W), or a combination thereof.

The cell array structure CAS may include a plurality of tiles 24. Each of the plurality of tiles 24 may include a plurality of memory cell blocks BLK1, BLK2, . . . , and BLKp. Each of the plurality of memory cell blocks BLK1, BLK2, . . . , and BLKp may include memory cells that are three-dimensionally arranged. In some example embodiments, two tiles 24 may constitute one mat, without being limited thereto. The memory cell array 20 described with reference to FIG. 1 may include a plurality of mats, for example, four mats, without being limited thereto.

Figure 3:
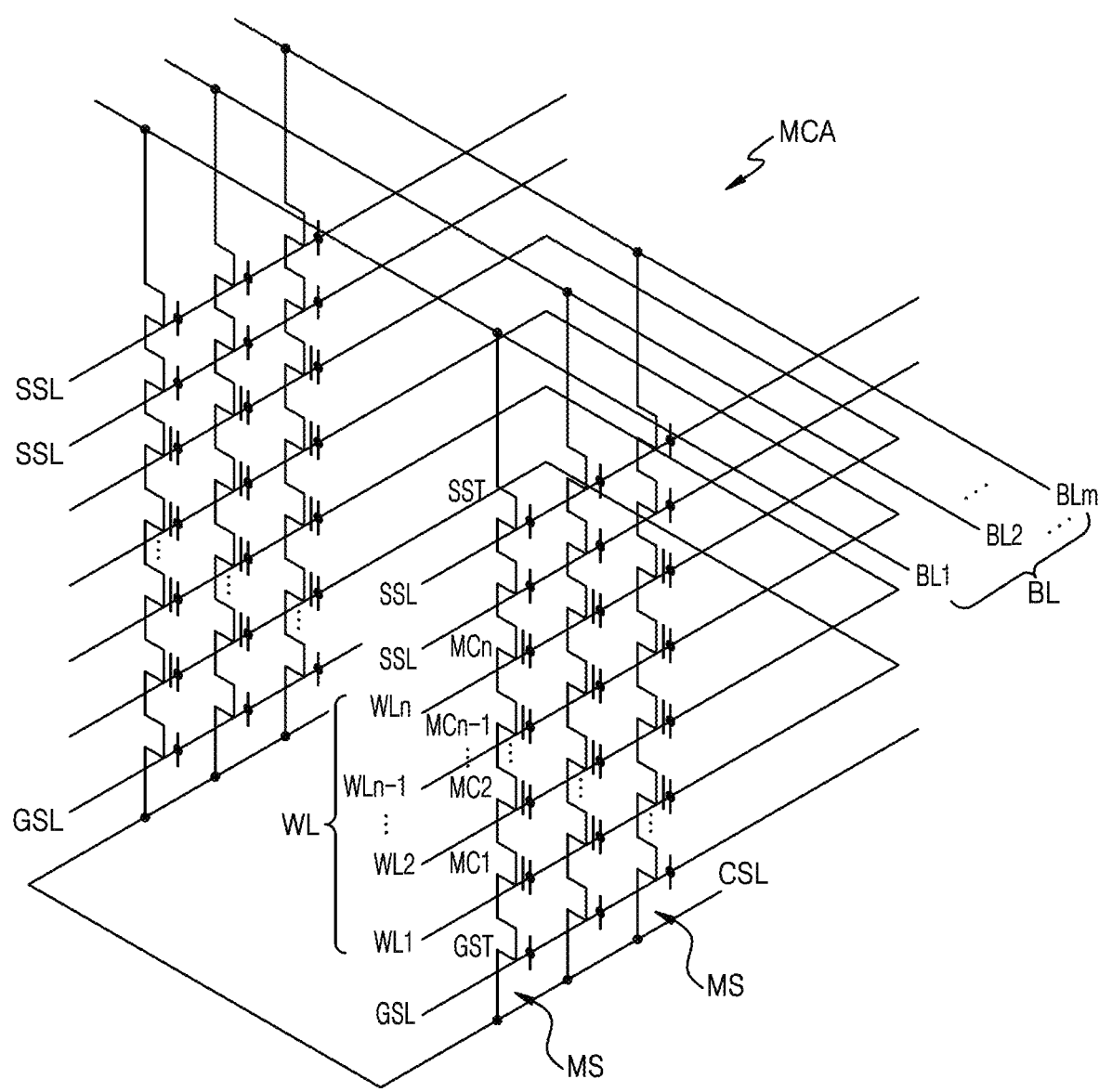
FIG. 3 is an equivalent circuit diagram of a memory cell array of a semiconductor device, according to some example embodiments.

FIG. 3 is an equivalent circuit diagram of a memory cell array MCA of a semiconductor device, according to some example embodiments. FIG. 3 illustrates an example of an equivalent circuit of a vertical-NAND (V-NAND) flash memory device having a vertical channel structure. Each of the plurality of memory cell blocks BLK1, BLK2, . . . , and BLKp shown in FIGS. 1 and 2 may include the memory cell array MCA having a circuit configuration shown in FIG. 3.

Referring to FIG. 3, the memory cell array MCA may include a plurality of memory cell strings MS. The memory cell array MCA may include a plurality of bit lines BL (BL1, BL2, . . . , and BLm), a plurality of word lines WL (WL1, WL2, . . . , WLn−1, and WLn), at least one string selection line SSL, at least one ground selection line GSL, and a common source line CSL. The plurality of memory cell strings MS may be formed between the plurality of bit lines BL and the common source line CSL. Although FIG. 3 illustrates an example in which each of the plurality of memory cell strings MS includes one ground selection line GSL and two string selection lines SSL, inventive concepts are not limited thereto. For example, each of the plurality of memory cell strings MS may include one string selection line SSL.

Each of the plurality of memory cell strings MS may include a string selection transistor SST, a ground selection transistor GST, and a plurality of memory cell transistors MC1, MC2, . . . , MCn−1, and MCn. A drain region of the string selection transistor SST may be connected to the bit line BL, and a source region of the ground selection transistor GST may be connected to the common source line CSL. The common source line CSL may be or may include a region to which source regions of a plurality of ground selection transistors GST are connected in common.

The string selection transistor SST may be connected to the string selection line SSL, and the ground selection transistor GST may be connected to the ground selection line GSL. Each of the plurality of memory cell transistors MC1, MC2, . . . , MCn−1, and MCn may be connected to the word line WL.

Figure 4:
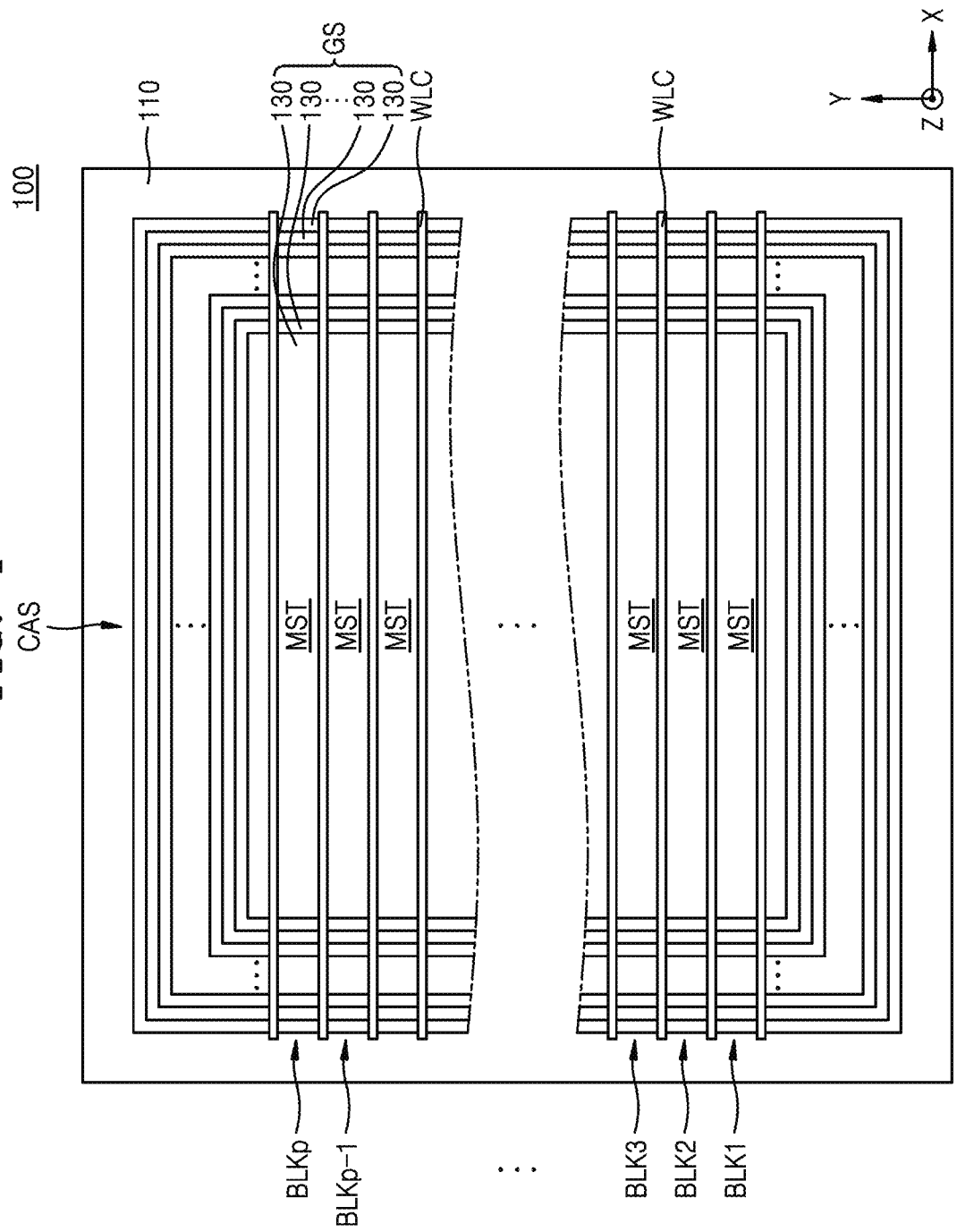
FIG. 4 is a schematic plan view of a partial region of a semiconductor device, according to some example embodiments.

FIG. 4 is a schematic plan view of a partial region of a semiconductor device 100 according to some example embodiments.

Referring to FIG. 4, the semiconductor device 100 may include a cell array structure CAS on a conductive plate 110. The conductive plate 110 and the cell array structure CAS may constitute or correspond to the memory cell array 20 of the semiconductor device 10 shown in FIG. 1. The conductive plate 110 may function as the common source line CSL shown in FIG. 3. The conductive plate 110 may support the cell array structure CAS. As used herein, the term "conductive plate" may be referred to as a "plate CSL," and the "conductive plate" may be synonymous with the "plate CSL."

The cell array structure CAS may include a plurality of memory cell blocks BLK1, BLK2, . . . , and BLKp. In some example embodiments, the conductive plate 110 may provide a path through which a common source voltage is applied to the cell array structure CAS. The first peripheral circuit structure (refer to PCS1 in FIG. 2) may be under, e.g. below or directly under, the cell array structure CAS shown in FIG. 4, and the second peripheral circuit structure (refer to PCS2 in FIG. 2) may be on, e.g. above or directly on, the cell array structure CAS. Each of a plurality of circuits included in the peripheral circuit 30 described with reference to FIG. 1 may be in at least one selected from the first peripheral circuit structure PCS1 and the second peripheral circuit structure PCS2.

The cell array structure CAS may include a plurality of gate lines 130, which are sequentially stacked on the conductive plate 110 in a vertical direction (Z direction). Areas of the plurality of gate lines 130 on an X-Y plane may gradually decrease as a distance from the conductive plate 110 increases.

The plurality of gate lines 130 may be divided into a plurality of memory cell blocks BLK1, BLK2, . . . , and BLKp by a plurality of word line cut regions WLC, which extend long in a first lateral direction (X direction). The plurality of gate lines 130 included in each of the plurality of memory cell blocks BLK1, BLK2, . . . , and BLKp may constitute or correspond to a gate stack GS. Each of the plurality of memory cell blocks BLK1, BLK2, . . . , and BLKp may include a memory stack MST including one gate stack GS. In each of the plurality of memory stacks MST, the plurality of gate lines 130 may constitute or correspond to the ground selection line GSL, the plurality of word lines WL, and the string selection line SSL, which are shown in FIG. 3.

Figure 5A:
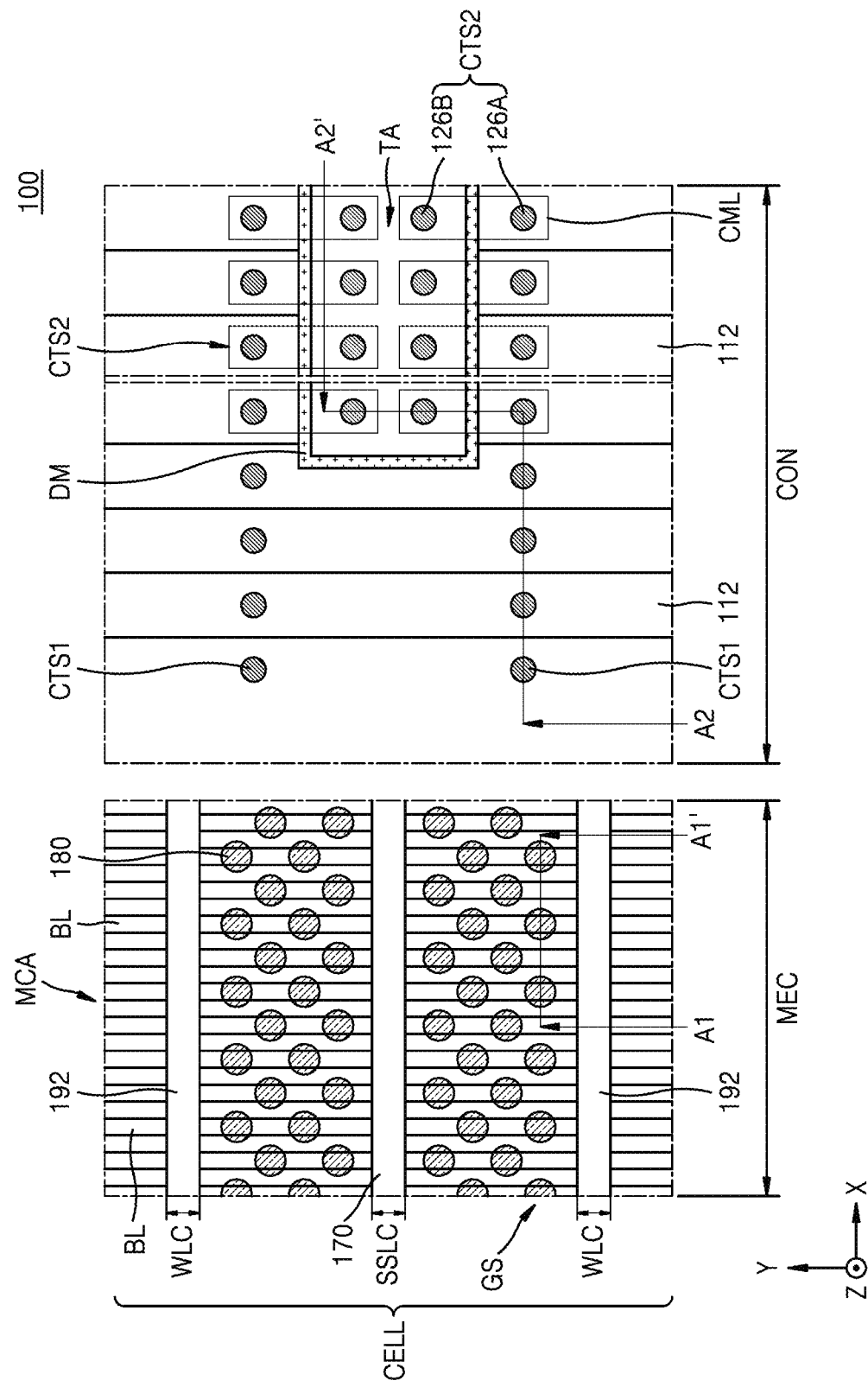
FIG. 5A illustrates a plan layout of some components of a cell region of a semiconductor device, according to some example embodiments.
Figure 5B:
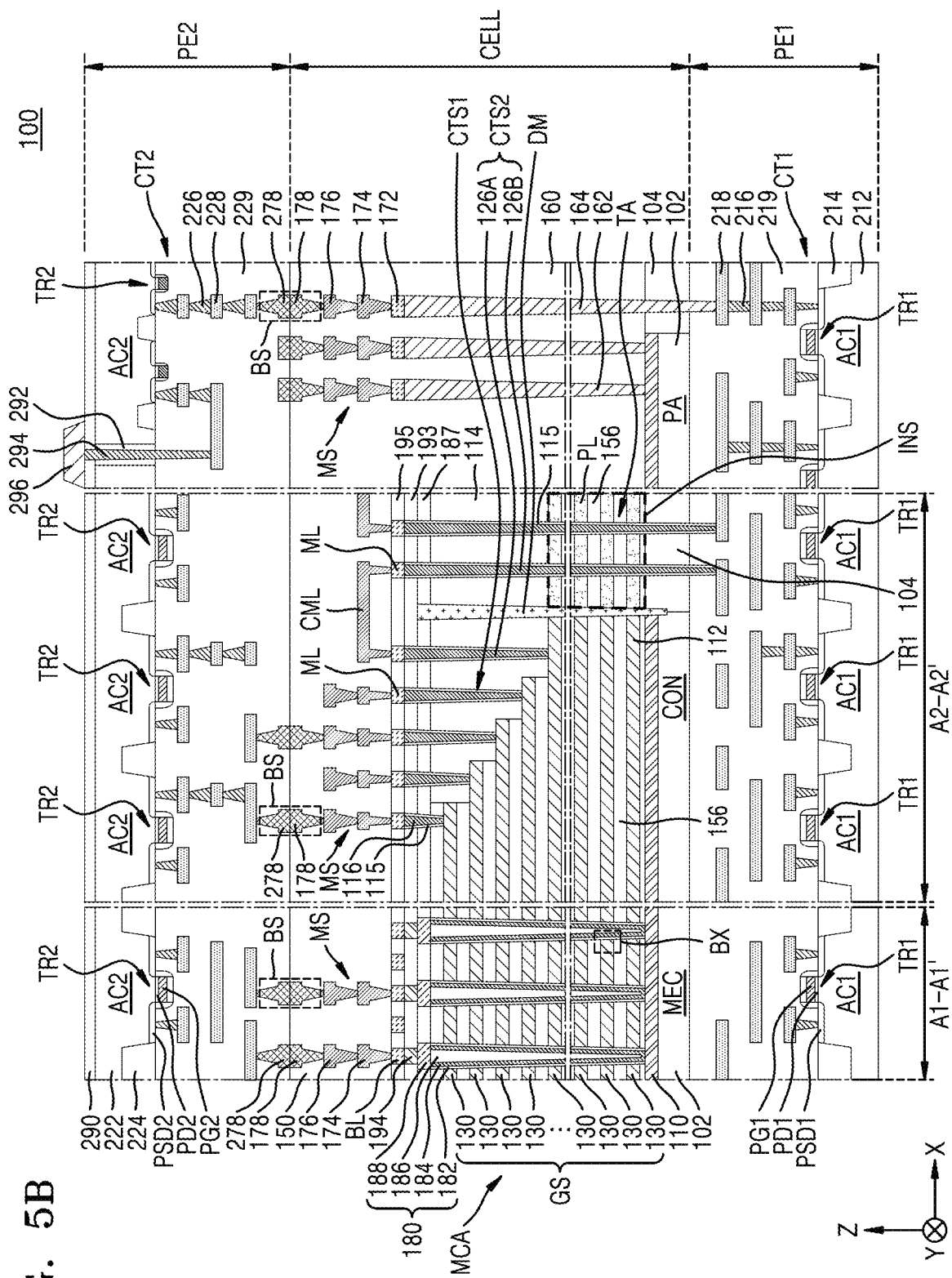
FIG. 5B is a cross-sectional view of partial regions of the semiconductor device shown in FIG. 5A.

FIG. 5A illustrates a plan layout of some components of a cell region CELL of a semiconductor device 100, according to some example embodiments. FIG. 5B is a cross-sectional view of respective partial regions of a first peripheral circuit region PE1, a cell region CELL, and a second peripheral circuit region PE2 of the semiconductor device 100. Referring to FIGS. 5A and 5B, the semiconductor device 100 may include the first peripheral circuit region PE1, the cell region CELL, and the second peripheral circuit region PE2. The cell region CELL may include a cell structure 102, which includes a memory cell region MEC, a connection region CON, and a pad bonding region PA. In FIG. 5B, a configuration of the cell region CELL on the memory cell region MEC may correspond to a cross-sectional configuration taken along line A1-A1' of FIG. 5A, and a configuration of the cell region CELL on the connection region CON may correspond to a cross-sectional configuration taken along line A2-A2' of FIG. 5A.

The first peripheral circuit region PE1, the cell region CELL, and the second peripheral circuit region PE2, which are shown in FIGS. 5A and 5B, may be included in any one selected from the plurality of memory cell blocks BLK1, BLK2, . . . , and BLKp shown in FIG. 4. The first peripheral circuit structure PCS1 shown in FIG. 2 may include the first peripheral circuit region PE1, the second peripheral circuit structure PCS2 shown in FIG. 2 may include the second peripheral circuit region PE2, and the cell array structure CAS shown in FIG. 2 may include the cell region CELL.

In some example embodiments, the semiconductor device 100 may have a chip-to-chip (C2C) structure. The formation of the C2C structure may include manufacturing or fabricating a first chip including the first peripheral circuit region PE1 and the cell region CELL on a first wafer, manufacturing or fabricating a second chip including the second peripheral circuit region PE2 formed on a second wafer different from the first wafer, and connecting the first chip and the second chip to each other by using a bonding technique. For example, the bonding technique may refer to a technique for bonding a first bonding metal pad 178 included in an uppermost metal layer of the first chip including the first peripheral circuit region PE1 and the cell region CELL to a second bonding metal pad 278 formed on an uppermost metal layer of the second chip including the second peripheral circuit region PE2 so that the first and second bonding metal pads 178 and 278 may be electrically connected to each other. In some example embodiments, when the first bonding metal pad 178 and the second bonding metal pad 278 include copper (Cu), the bonding technique may be or may include a Cu—Cu bonding technique. Alternatively or additionally in some example embodiments, each of the first bonding metal pad 178 and the second bonding metal pad 278 may include aluminum (Al) or tungsten (W).

The first peripheral circuit region PE1 may include a first peripheral circuit substrate 212 and a plurality of lower circuits CT1. The plurality of lower circuits CT1 may be formed between the first peripheral circuit substrate 212 and the cell region CELL. The first peripheral circuit substrate 212 may include a semiconductor material, for example, a Group IV semiconductor material, a Group III-V compound semiconductor material, and/or a Group II-VI compound material. The plurality of lower circuits CT1 may include at least some, e.g. at least one, of the row decoder 32, the page buffer 34, the data I/O circuit 36, the control logic 38, and the CSL driver 39, which are included in the peripheral circuit 30 described with reference to FIG. 1. In some example embodiments, the plurality of lower circuits CT1 may further include unit elements, such as passive elements including a resistor and/or a capacitor and other active elements such as diodes.

A first device isolation film 214 defining a plurality of first active regions AC1 may be formed in the first peripheral circuit substrate 212, e.g. may be formed with a spin-on glass (SOG) process. A plurality of first transistors TR1 may be formed on the plurality of first active regions AC1, and a plurality of lower conductive plugs 216 and a plurality of lower conductive lines 218 may be on the first peripheral circuit substrate 212 and the plurality of first transistors TR1. The plurality of lower conductive plugs 216 and the plurality of lower conductive lines 218 may constitute or correspond to a wiring structure of the first peripheral circuit region PE1.

The plurality of first transistors TR1, the plurality of lower conductive plugs 216, and the plurality of lower conductive lines 218 may respectively constitute or correspond to some of the plurality of lower circuits CT1 formed in the first peripheral circuit region PE1. Each of the plurality of first transistors TR1 may be electrically connectable to the cell region CELL through a plurality of wiring structures. The plurality of wiring structures may include a second contact structure CTS2 and a connection contact plug 164, which will be described below with reference to FIG. 5B. Each of the plurality of first transistors TR1 may include a first gate dielectric film PD1, a first gate electrode PG1, and a pair of first source/drain regions PSD1. Each of the plurality of lower conductive plugs 216 may connect some selected from the plurality of first transistors TR1 and the plurality of lower conductive lines 218 in a vertical direction (Z direction). A first interlayer insulating film 219 may cover the plurality of first transistors TR1, the plurality of lower conductive plugs 216, and the plurality of lower conductive lines 218.

The cell region CELL may overlap the first peripheral circuit region PE1 in the vertical direction (Z direction). The cell region CELL may include a cell substrate 102 and a conductive plate 110, which are adjacent to the first peripheral circuit region PE1. The cell substrate 102 may be formed on the first interlayer insulating film 219 of the first peripheral circuit region PE1. The conductive plate 110 may be formed on, e.g. directly on, the cell substrate 102. In some example embodiments, a lower surface of the cell substrate 102 may be in contact with an uppermost surface of the first interlayer insulating film 219. The conductive plate 110 may extend in a lateral direction along an X-Y plane on the cell substrate 102. The cell substrate 102 may include a semiconductor substrate. The conductive plate 110 may include a metal film, a semiconductor film, or a combination thereof.

A plurality of first bonding metal pads 178 may be at an uppermost portion of the cell region CELL. The plurality of first bonding metal pads 178 may be insulated from each other by interlayer insulating films 150 and 160 in the cell region CELL. The interlayer insulating films 150 and 160 may include a silicon oxide film, a silicon nitride film, or a combination thereof.

The second peripheral circuit region PE2 may be over, e.g. directly over, the cell region CELL. The second peripheral circuit region PE2 may overlap the first peripheral circuit region PE1 and the cell region CELL in the vertical direction (Z direction). The second peripheral circuit region PE2 may be apart from the first peripheral circuit region PE1 with the cell region CELL therebetween in the vertical direction (Z direction).

The second peripheral circuit region PE2 may include a second peripheral circuit substrate 222 and a plurality of upper circuits CT2. The plurality of upper circuits CT2 may be formed between the second peripheral circuit substrate 222 and the cell region CELL. The second peripheral circuit substrate 222 may include a semiconductor material, for example, a Group IV semiconductor material, a Group III-V compound semiconductor material, or a Group II-VI compound material. The second peripheral circuit substrate 222 may include the same, or different, materials than those of the first peripheral circuit substrate 212. The plurality of upper circuits CT2 may include at least some of, e.g. at least one of, the row decoder 32, the page buffer 34, the data I/O circuit 36, the control logic 38, and the CSL driver 39, which are included in the peripheral circuit 30 described with reference to FIG. 1. In some example embodiments, the plurality of upper circuits CT2 may further include unit elements such as passive circuit elements such as a resistor and/or a capacitor, and/or active circuit elements such as a diode.

A second device isolation film 224 defining a plurality of second active regions AC2 may be formed in the second peripheral circuit substrate 222. A plurality of second transistors TR2 may be formed on the plurality of second active regions AC2, and a plurality of upper conductive plugs 226 and a plurality of upper conductive lines 228 may be on the second peripheral circuit substrate 222 and the plurality of second transistors TR2. The plurality of upper conductive plugs 226 and the plurality of upper conductive lines 228 may constitute or correspond to a wiring structure of the second peripheral circuit region PE2.

Each of the plurality of upper conductive plugs 226 may connect some selected from the plurality of second transistors TR2 and the plurality of upper conductive lines 228 in the vertical direction (Z direction). Each of the plurality of second transistors TR2 may include a second gate dielectric film PD2, a second gate electrode PG2, and a pair of second source/drain regions PSD2. The plurality of second transistors TR2, the plurality of upper conductive plugs 226, and the plurality of upper conductive lines 228 may respectively constitute or correspond to some of the plurality of upper circuits CT2 formed in the second peripheral circuit region PE2.

The second peripheral circuit region PE2 may include a plurality of second bonding metal pads 278 on the wiring structure including the plurality of upper conductive plugs 226 and the plurality of upper conductive lines 228. The plurality of second bonding metal pads 278 may be bonded to the plurality of first bonding metal pads 178 of the cell region CELL and electrically connectable to the plurality of first bonding metal pads 178. The plurality of first bonding metal pads 178 and the plurality of second bonding metal pads 278 may constitute a plurality of bonding structures BS.

A second interlayer insulating film 229 may cover the plurality of second transistors TR2, the plurality of upper conductive plugs 226, the plurality of upper conductive lines 228, and the plurality of second bonding metal pads 278.

In some example embodiments, each of the plurality of lower conductive plugs 216 and the plurality of lower conductive lines 218, which are in the first peripheral circuit region PE1, and each of the plurality of upper conductive plugs 226 and the plurality of upper conductive lines 228, which are in the second peripheral circuit region PE2, may include tungsten, aluminum, copper, or a combination thereof, without being limited thereto, and may include or consist of the same, or different, materials. Each of the first device isolation film 214 and the second device isolation film 224 may include a silicon oxide film, a silicon nitride film, or a combination thereof, and may include or consist of the same, or different, materials. Each of the first interlayer insulating film 219 and the second interlayer insulating film 229 may include a silicon oxide film, a silicon nitride film, or a combination thereof, and may include the same, or different, materials. Each of the plurality of first bonding metal pads 178 and the plurality of second bonding metal pads 278, which constitute the bonding structures BS, may include copper, aluminum, or tungsten, and may include or consist of the same, or different, materials.

The memory cell array MCA may be on, e.g. directly on, the conductive plate 110 in the cell region CELL. Although FIGS. 5A and 5B illustrate a case in which the connection region CON is on only one side of the memory cell region MEC, connection regions CON may be respectively on both sides of the memory cell region MEC in a first lateral direction (X direction).

A gate stack GS may be on, e.g. directly on, the memory cell region MEC and the connection region CON of the cell substrate 102. The gate stack GS may include the plurality of gate lines 130 and a plurality of conductive pad regions 112 integrally connected to the plurality of gate lines 130. A portion of the gate stack GS, which is on or directly on the memory cell region MEC, may constitute or correspond to the memory cell array MCA. The memory cell array MCA may include 48, 64, 96, or 128 gate lines 130, which are stacked in a vertical direction (Z direction), without being limited thereto. The plurality of gate lines 130 included in the gate stack GS may be on the memory cell region MEC and extend in a lateral direction parallel to the cell substrate 102 and overlap each other in the vertical direction (Z direction). The plurality of gate lines 130 may include the plurality of word lines WL, the ground selection line GSL, and the string selection line SSL, which are shown in FIG. 3.

In the cell region CELL, the plurality of conductive pad region 112 included in the gate stack GS may be on the connection region CON and constitute or correspond to a step connection unit, e.g. a staircase connection region. Each of the plurality of conductive pad regions 112 may be integrally connected to one selected from the plurality of gate lines 130.

As shown in FIG. 5A, a plurality of word line cut regions WLC may extend in the first lateral direction (X direction) on the cell substrate 102. The plurality of word line cut regions WLC may define a width of the gate stack GS in a second lateral direction (Y direction) perpendicular to the first lateral direction (X direction). Each of the plurality of word line cut regions WLC may be filled with a word line cut structure 192. The word line cut structure 192 may include an insulating film, polysilicon, a metal film, or a combination thereof. In some example embodiments, the word line cut structure 192 may include a silicon oxide film, a silicon nitride film, a polysilicon film, a tungsten film, or a combination thereof, but materials of the word line cut structure 192 are not limited thereto.

In the memory cell array MCA, two string selection lines SSL, which are adjacent to each other in the second lateral direction (Y direction), may be apart from each other with a string selection line cut region SSLC therebetween. The string selection line cut region SSLC may be filled with an insulating film 170. The insulating film 170 may include an oxide film, a nitride film, or a combination thereof. In some example embodiments, at least a portion of the string selection line cut region SSLC may be filled with an air gap. As used herein, the term "air" may refer to other gases that may be in the atmosphere or during a manufacturing process. The air gap may be under vacuum, e.g. may have a pressure lower than atmospheric pressure; however, example embodiments are not limited thereto.

Each of the plurality of gate lines 130 and the plurality of conductive pad regions 112 may include a metal, a conductive metal nitride, or a combination thereof. For example, each of the plurality of gate lines 130 and the plurality of conductive pad regions 112 may include tungsten, nickel, cobalt, tantalum, tungsten nitride, titanium nitride, tantalum nitride, or a combination thereof, without being limited thereto.

As shown in FIG. 5B, the cell region CELL may include a plurality of insulating films 156 covering an upper surface and a lower surface of each of the plurality of gate lines 130. The insulating film 156, which is closest to the cell substrate 102, from among the plurality of insulating films 156, may have a smaller thickness than the other insulating films 156, without being limited thereto. The plurality of insulating films 156 may include silicon oxide, silicon nitride, or silicon oxynitride (SiON), or combinations thereof.

In the memory cell region MEC, a plurality of channel structures 180 may pass through the plurality of gate lines 130 and the plurality of insulating films 156 and may extend long in the vertical direction (Z direction) on the conductive plate 110. The plurality of channel structures 180 may be arranged a predetermined distance apart from each other in a first lateral direction (X direction) and the second lateral direction (Y direction).

Each of the plurality of channel structures 180 may include a gate dielectric film 182, a channel region 184, a buried insulating film 186, and a drain region 188. The channel region 184 may include doped polysilicon and/or undoped polysilicon. The channel region 184 may have a cylindrical shape. An inner space of the channel region 184 may be filled with the buried insulating film 186. The buried insulating film 186 may include an insulating material. For example, the buried insulating film 186 may include silicon oxide, silicon nitride, SiON, or a combination thereof. In some example embodiments, the buried insulating film 186 may be omitted. In this case, the channel region 184 may have a pillar structure with no inner space. The drain region 188 may include doped polysilicon, a metal, a conductive metal nitride, or a combination thereof. Examples of a metal that may be included in the drain region 188 may include tungsten, nickel, cobalt, and tantalum. The plurality of channel structures 180 may have a tapered profile; however, example embodiments are not limited thereto.

A plurality of drain regions 188 may be insulated from each other by middle insulating films 187. Each of the middle insulating films 187 may include an oxide film, a nitride film, or a combination thereof.

FIG. 5B illustrates an example in which the channel structure 180 includes the gate dielectric film 182 and the gate dielectric film 182 has a shape extending long along the channel region 184 in the vertical direction (Z direction), but inventive concepts are not limited thereto and various modifications may be made.

Figure 6A:
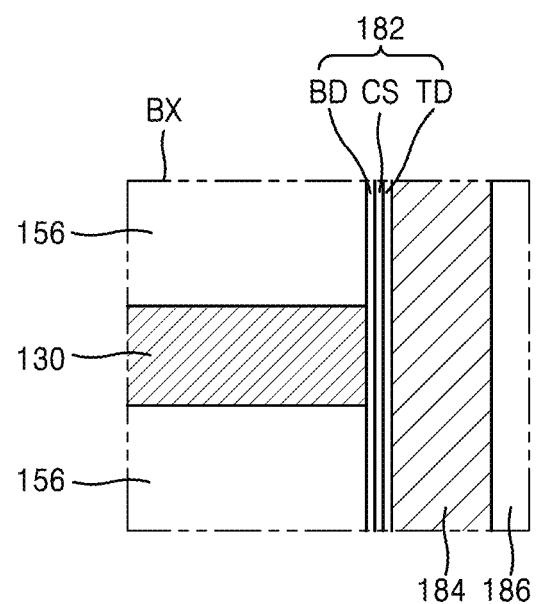
FIGS. 6A to 6D are detailed cross-sectional views of examples of a gate dielectric film included in a semiconductor device, according to some example embodiments.

FIG. 6A is a detailed cross-sectional view of the gate dielectric film 182 shown in FIG. 5B, which is an enlarged view of region "BX" of FIG. 5B.

Referring to FIG. 6A, the gate dielectric film 182 may have a structure including a tunneling dielectric film TD, a charge storage film CS, and a blocking dielectric film BD, which are sequentially formed on the channel region 184. Relative thicknesses of the tunneling dielectric film TD, the charge storage film CS, and the blocking dielectric film BD are not limited to examples shown in FIG. 6A and may be variously modified.

The tunneling dielectric film TD may include at least one of silicon oxide, hafnium oxide, aluminum oxide, zirconium oxide, and tantalum oxide. The charge storage film CS may be or include a region in which electrons that have passed the tunneling electric film TD from the channel region 184 may be stored. The charge storage film CS may include silicon nitride, boron nitride, silicon boron nitride, or doped polysilicon. The blocking dielectric film BD may include silicon oxide, silicon nitride, or a metal oxide having a higher dielectric constant than silicon oxide. The metal oxide may include hafnium oxide, aluminum oxide, zirconium oxide, tantalum oxide, or a combination thereof.

Figure 6B:
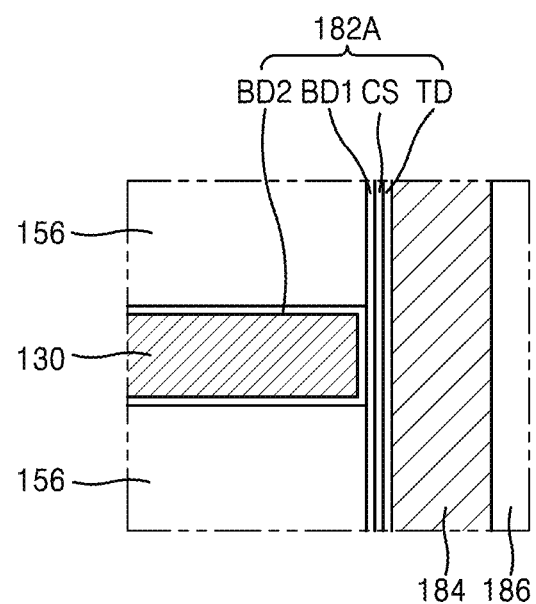
Figure 6C:
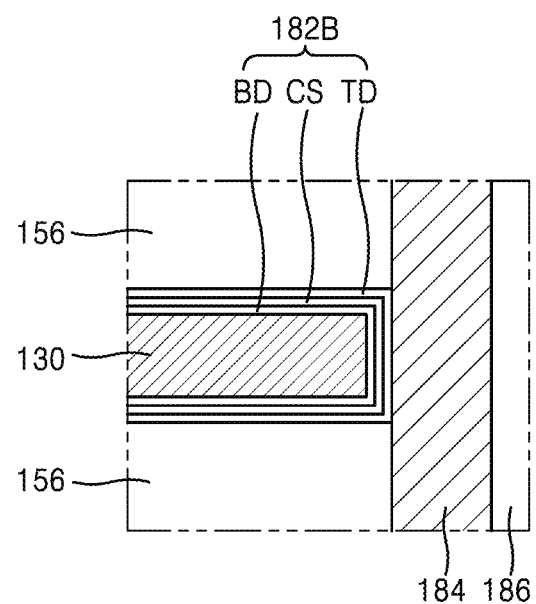
Figure 6D:
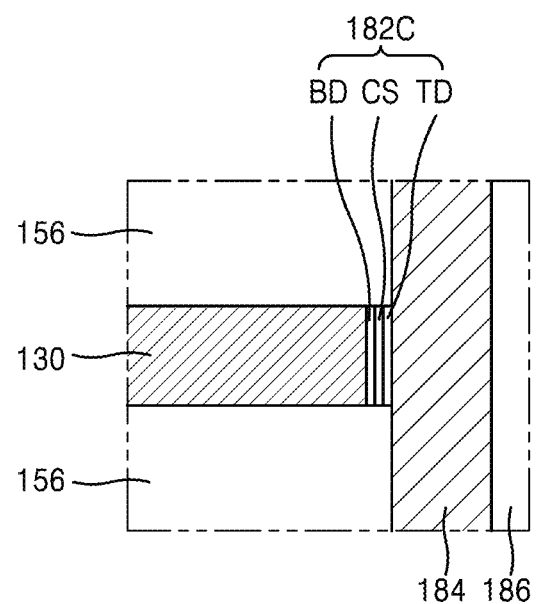

FIGS. 6B to 6D are cross-sectional views of some example structures of gate dielectric films 182A, 182B, and 182C, which may be adopted instead of the gate dielectric film 182 shown in FIG. 6A. FIGS. 6B to 6D each illustrate a sectional configuration of a region corresponding to region "BX" of FIB. 5B.

In some example embodiments, the semiconductor device 100 shown in FIGS. 5A and 5B may include a gate dielectric film 182A shown in FIG. 6B instead of the gate dielectric film 182. The gate dielectric film 182A may have substantially the same configuration as the gate dielectric film 182 shown in FIG. 6A. However, the gate dielectric film 182A includes a first blocking dielectric film BD1 and a second blocking dielectric film BD2 instead of the blocking dielectric film BD The first blocking dielectric film BD1 may extend in parallel with a channel region 184, and the second blocking dielectric film BD2 may surround a gate line 130. Each of the first blocking dielectric film BD1 and the second blocking dielectric film BD2 may include at least one of silicon oxide, silicon nitride, or a metal oxide. For example, the first blocking dielectric film BD1 may include, e.g. may consist of, a silicon oxide film, while the second blocking dielectric film BD2 may include, e.g. may consist of, a metal oxide film having a higher dielectric constant than the silicon oxide film.

Alternatively or additionally, in some example embodiments, the semiconductor device 100 shown in FIGS. 5A and 5B may include the gate dielectric film 182B shown in FIG. 6C instead of the gate dielectric film 182. The gate dielectric film 182B may be formed to cover a surface of the gate line 130, which faces the channel region 184, and surfaces of the gate line 130, which face insulating films 156. The gate dielectric film 182B may include a tunneling dielectric film TD, a charge storage film CS, and a blocking dielectric film BD, which are sequentially formed on the channel region 184.

Alternatively or additionally, in some example embodiments, the semiconductor device 100 shown in FIGS. 5A and 5B may include the gate dielectric film 182C shown in FIG. 6D instead of the gate dielectric film 182. The gate dielectric film 182C may be between the gate line 130 and the channel region 184 and cover a sidewall of the gate line 130 without covering a lower surface and an upper surface of the gate line 130. The gate dielectric film 182C may include the tunneling dielectric film TD, the charge storage film CS, and the blocking dielectric film BD, which are sequentially formed on the channel region 184.

A configuration and/or a shape of a gate dielectric film that may be included in a semiconductor device according to some example embodiments is not limited to those of the gate dielectric films 182, 182A 182B, and 182C shown in FIGS. 6A to 6D and may be variously modified and changed within the scope of inventive concepts.

Referring back to FIGS. 5A to 5B, a plurality of conductive pad regions 112, which constitute or correspond to a step/stair connection unit on the connection region CON of the cell region CELL, may have a width that gradually decreases in a direction away from a cell substrate 102 in a lateral direction (e.g., X direction). In some example embodiments, a plurality of dummy channel structures (not shown) passing through the plurality of conductive pad regions 112 may be on the connection region CON. The plurality of dummy channel structures may support respective edge portions of a gate stack GS and the plurality of conductive pad regions 112, and thus, the occurrence of undesired structural deformation (e.g., bending or breaking) of the edge portions of the gate stack GS and the plurality of conductive pad regions 112 may be prevented or reduced in likelihood of occurrence.

In the cell region CELL, a plurality of bit lines BL may be respectively on the plurality of channel structures 180. A plurality of bit line contact pads 194 may be between the plurality of channel structures 180 and the plurality of bit lines BL. A drain region 188 of each of the plurality of channel structures 180 may be connected to a corresponding one of the plurality of bit lines BL through the bit line contact pad 194. The plurality of bit line contact pads 194 may be insulated from each other by an upper insulating film 193. The plurality of bit lines BL may be insulated from each other by an interlayer insulating film 195. Each of the plurality of bit line contact pads 194 and the plurality of bit lines BL may include a metal, a metal nitride, or a combination thereof. For example, each of the plurality of bit line contact pads 194 and the plurality of bit lines BL may include tungsten, titanium, tantalum, copper, aluminum, titanium nitride, tantalum nitride, tungsten nitride, or a combination thereof. Each of the upper insulating film 193 and the interlayer insulating film 195 may include silicon oxide film, silicon nitride film, or a combination thereof.

In the cell region CELL, a connection-unit insulating film 114 covering the plurality of conductive pad regions 112 may be between the cell substrate 102 and a middle insulating film 187. The connection-unit insulating film 114 may cover the plurality of conductive pad regions 112. The connection-unit insulating film 114 may include a silicon oxide film, a silicon nitride film, or a combination thereof.

In the connection region CON, a plurality of first contact structures CTS1 and a plurality of second contact structures CTS2 may be on, e.g. directly on, the plurality of conductive pad regions 112. A plurality of wiring layers ML may be on the plurality of first contact structures CTS1 and the plurality of second contact structures CTS2. The plurality of wiring layers ML may be formed at the same level as, e.g. planar with, the plurality of bit lines BL.

Each of the plurality of first contact structures CTS1 may include a contact plug 116, which extends long in a vertical direction (Z direction). A sidewall of the contact plug 116 may be surrounded by an insulating plug 115. The contact plug 116 of the first contact structure CTS1 may be electrically connectable to the conductive pad region 112. The contact plug 116 may be connected to the wiring layer ML formed on the interlayer insulating film 195.

Each of the plurality of second contact structures CTS2 may include a first contact plug 126A and a second contact plug 126B, which extend long in the vertical direction (Z direction). A sidewall of each of the first contact plug 126A and the second contact plug 126B may be surrounded by the insulating plug 115. The first contact plug 126A of the second contact structure CTS2 may be electrically connectable to the conductive pad region 112. Each of the first contact plug 126A and the second contact plug 126B may be connected to the wiring layer ML formed on the interlayer insulating film 195.

From among a plurality of gate lines 130, some gate lines 130, e.g. one gate line 130, may be connected to at least one or exactly one selected from a plurality of upper circuits CT2, which are included in a second peripheral circuit region PE2, through the conductive pad region 112, the first contact structure CTS1, and a bonding structure BS. The others of the plurality of gate lines 130 may be connected to at least one or exactly one selected from a plurality of lower circuits CT1, which are included in a first peripheral circuit region PE1, through the conductive pad region 112 and the second contact structure CTS2.

In the cell region CELL, a dam structure DM defining a through electrode area TA may be on the connection region CON. The dam structure DM may pass through the connection-unit insulating film 114, the plurality of conductive pad regions 112, a plurality of insulating films 156, and a conductive plate 110 and extend in the vertical direction (Z direction) on the cell structure 102. The dam structure DM may include or consist of an insulating material such as a silicon oxide film, a silicon nitride film, a polysilicon film, or a combination thereof.

A portion of the through electrode area TA defined by the dam structure DM may be filled with an insulating island INS. The insulating island INS may be apart from the plurality of conductive pad regions 112 with the dam structure DM therebetween in the lateral direction. The insulating island INS may include a multilayered insulating film in which the insulating film 156 and a sacrificial insulating film PL are alternately stacked one by one plural times. In the insulating island INS, the insulating film 156 may include (e.g. may consist of) a silicon oxide film, and the sacrificial insulating film PL may include (e.g. may consist of) a silicon nitride film. In some example embodiments, the insulating island INS may include a single insulating film. In the through electrode area TA defined by the dam structure DM, an upper portion of the insulating island INS may be filled with a portion of the connection-unit insulating film 114, a portion of a middle insulating film 187, a portion of an upper insulating film 193, and a portion of an interlayer insulating film 195.

In the through electrode area TA defined by the dam structure DM, each of a plurality of second contact plugs 126B may pass through the insulating island INS, the connection-unit insulating film 114, the middle insulating film 187, the upper insulating film 193, and the interlayer insulating film 195 and extend in the vertical direction (Z direction). Each of the plurality of second contact plugs 126B may be connected to the wiring layer ML formed on the interlayer insulating film 195.

The cell region CELL may include a plurality of insulating plugs 104, which pass through the cell substrate 102 and the conductive plate 110. Some of the plurality of insulating plugs 104 may vertically overlap the through electrode area TA defined by the dam structure DM. Each of the plurality of second contact plugs 126B may pass through the insulating plug 104 and extend long into the first peripheral circuit region PE1 in the vertical direction (Z direction). Each of the plurality of second contact plugs 126B may include a portion surrounded by the insulating plug 104 and the insulating island INS. Each of the plurality of second contact plugs 126B may be connected to a peripheral circuit included in the first peripheral circuit region PE1.

Each of the first contact plug 126A and the second contact plug 126B, which are included in the plurality of second contact structures CTS2, may be connected to a connection wiring layer CML through the wiring layer ML. The first contact plug 126A and the second contact plug 126B may be connected to each other through the wiring layer ML and the connection wiring layer CML. A partial region of each of the plurality of second contact plugs 126B may be surrounded by a first interlayer insulating film 219 in the first peripheral circuit region PE1.

FIGS. 5A and 5B illustrate a configuration in which the first contact plug 126A and the second contact plug 126B included in the second contact structure CTS2 are adjacent to each other in a first lateral direction (X direction) on the conductive pad region 112, but inventive concepts are not limited thereto. The first contact plug 126A and the second contact plug 126B in the second contact structure CTS2 may be variously arranged as needed.

In some example embodiments, the plurality of lower circuits CT1 in the first peripheral circuit region PE1 may include a portion of a circuit included in the row decoder 32 described with reference to FIG. 1, and the plurality of upper circuits CT2 in the second peripheral circuit region PE2 may include another portion of the circuit included the row decoder 32 described with reference to FIG. 1.

Some of the plurality of gate lines 130 may be connected to an upper circuit CT2 included in the row decoder 32, from among the plurality of upper circuits CT2 included in the second peripheral circuit region PE2, through the first contact structure the CTS1 and the bonding structure BS. The others of the plurality of gate lines 130 may be connected to an upper circuit CT2 included in the row decoder 32, from among the plurality of upper circuits CT2 included in the first peripheral circuit region PE2, through the second contact structure CTS2. Each of the plurality of first contact structures CTS1 may pass through the connection-unit insulating film 114, the middle insulating film 187, and the upper insulating film 193 from the conductive pad region 112 and the vertical direction (Z direction) in a direction away from the cell structure 102. Each of the plurality of wiring layers ML may be electrically connectable to one or at least one selected from the plurality of conductive pad regions 112 through one selected from a plurality of contact plugs 116 and a plurality of first contact plugs 126A. The plurality of wiring layers ML may be insulated from each other by the interlayer insulating film 195.

In the cell region CELL, a plurality of common source line contact plugs 162 may be on or directly on a pad bonding region PA of the cell substrate 102. One end of each of the plurality of common source line contact plugs 162 may be connected to a wiring layer 172, while another end thereof may be connected to the conductive plate 110. In some example embodiments, the wiring layer 172 may be formed at the same level as the plurality of wiring layers ML, without being limited thereto. Each of the plurality of common source line contact plugs 162 may include a metal, a metal compound, doped or undoped polysilicon, or a combination thereof. Each of the plurality of wiring layers ML and a plurality of wiring layers 172 may include tungsten, titanium, tantalum, copper, aluminum, titanium nitride, tantalum nitride, tungsten nitride, or a combination thereof. In some example embodiments, the plurality of bit lines BL, the plurality of wiring layers ML, and the plurality of wiring layers 172 may include, e.g. may consist of, the same material as each other.

In the second peripheral circuit region PE2, an I/O pad 296 may be on or directly on a second peripheral circuit substrate 222. A lower surface of the second peripheral circuit substrate 222, which is opposite to an upper surface of the second peripheral circuit substrate 222 that faces the cell region CELL, may be covered by a peripheral circuit insulating film 290. The I/O pad 296 may be formed on the peripheral circuit insulating film 290. The I/O pad 296 may be connected to at least one of a plurality of second transistors TR2, which are in the second peripheral circuit region PE2, through an I/O contact plug 294 passing through the peripheral circuit insulating film 290 and the second peripheral circuit substrate 222. Insulating spacers 292 may be between the second peripheral circuit substrate 222 and the I/O contact plug 294. The I/O pad 296 and the I/O contact plug 294 may include a metal, for example, aluminum and/or tungsten. Each of the peripheral circuit insulating film 290 and the insulating spacers 292 may include an oxide film, a nitride film, or a combination thereof. Although not shown, a lower I/O pad (not shown) having the same structure as or a similar structure to that of the I/O pad 296 may be on a lower surface of a first peripheral circuit substrate 212 in the first peripheral circuit region PE1. The lower I/O pad may be connected to at least one of a plurality of first transistors TR1, which are in the first peripheral circuit region PE1, through a lower I/O contact plug (not shown) passing through the first peripheral circuit substrate 212.

In the cell region CELL, a connection contact plug 164 may be apart from the cell substrate 102 and the conductive plate 110 in the lateral direction (e.g., X direction). The connection contact plug 164 may pass through the insulating plug 104 and an interlayer insulating film 160 and extend long in the vertical direction (Z direction). One end of the connection contact plug 164, which is adjacent to the second peripheral circuit region PE2, may be connected to the upper circuit CT2, which is in the second peripheral circuit region PE2, through the wiring layer 172, a first upper wiring layer 174, a second upper wiring layer 176, and a first bonding metal pad 178. Another end of the connection contact plug 164 may extend into the first peripheral circuit region PE1 and be connected to at least one first transistor TR1 through a plurality of lower conductive plugs 216 and a plurality of lower conductive lines 218 of the first peripheral circuit region PE1. A partial region of the connection contact plug 164 may be surrounded by the first interlayer insulating film 219 in the first peripheral circuit region PE1.

In the cell region CELL, a plurality of first upper wiring layers 174 and a plurality of second upper wiring layer 176, which are on the plurality of bit lines BL, the plurality of wiring layers ML, and the plurality of wiring layers 172, may constitute a wiring structure MS of the cell region CELL. Although FIG. 5B illustrates a case in which the wiring structure MS includes a double wiring structure including the plurality of first upper wiring layers 174 and the plurality of second upper wiring layers 176, inventive concepts is are limited thereto. For example, the wiring structure MS may include a single wiring structure including the plurality of first upper wiring layers 174 or the plurality of second upper wiring layers 176 or a multilayered wiring structure including at least three layers.

On the connection region CON of the cell region CELL, each of the plurality of first contact structures CTS1 may be connected to the upper circuit CT2, which is in the second peripheral circuit region PE2, through the wiring layer ML and the bonding structure BS.

Each of the plurality of second contact structures CTS2 may pass through the connection-unit insulating film 114, the middle insulating film 187, the upper insulating film 193, and the interlayer insulating film 195 from the conductive pad region 112 and may extend in the vertical direction (Z direction) in the direction away from the cell substrate 102.

In the cell region CELL, each of the plurality of common source line contact plugs 162 and the connection contact plug 164 may be connected to or directly connected to the upper circuit CT2, which is in the second peripheral circuit region PE2, through the wiring layer 172, the wiring structure MS, and the bonding structure BS. For example, the plurality of common source line contact plugs 162 may be connected to the CSL driver (refer to 39 in FIG. 1) in the second peripheral circuit region PE2.

In some example embodiments, each of the plurality of contact plugs 116 included in the plurality of first contact structures CTS1, the plurality of first contact plugs 126A and the plurality of second contact plugs 126B, which are included in the plurality of second contact structures CTS2, the connection wiring layer CML, the plurality of common source line contact plugs 162, the connection contact plug 164, and the plurality of first upper wiring layers 174 and the plurality of second upper wiring layers 176, which are included in the wiring structure MS, may include tungsten, titanium, tantalum, copper, aluminum, titanium nitride, tantalum nitride, tungsten nitride, or a combination thereof. A plurality of insulating plugs 115 may include a silicon nitride film, a silicon oxide film, or a combination thereof.

The plurality of first transistors TR1 in the first peripheral circuit region PE1 and the plurality of second transistors TR2 in the second peripheral circuit region PE2 may constitute or correspond to or be included in a plurality of circuits CT1 and CT2, respectively. The plurality of circuits CT1 and CT2 may include circuits included in the peripheral circuit 30 described with reference to FIG. 1, for example, the row decoder 32, the page buffer 34, the data I/O circuit 36, the control logic 38, and the CSL driver 39. In some example embodiments, unit elements, such as passive circuits such as a resistor and/or a capacitor, and/or other active components such as a diode, may be further in each of the first peripheral circuit region PE1 and the second peripheral circuit region PE2.

In the first peripheral circuit region PE1, the plurality of first transistors TR1 may be electrically connectable to a memory cell array MCA of the cell region CELL through a wiring structure including the plurality of lower conductive plugs 216 and the plurality of lower conductive lines 218. In the second peripheral circuit region PE2, the plurality of second transistors TR2 may be electrically connectable to the memory cell array MCA of the cell region CELL through a wiring structure including the plurality of upper conductive plugs 226 and the plurality of upper conductive lines 228 and a plurality of bonding structure BS. In the cell region CELL, the channel structure 180 may be electrically connected to the plurality of upper circuits CT2 included in the second peripheral circuit region PE2 through the bit line contact pad 194, the bit line BL, the wiring structure MS including the first upper wiring layer 174 and the second upper wiring layer 176, and the bonding structure BS. For example, the channel structure 180 may be electrically connected to the page buffer (refer to 34 in FIG. 1) included in the second peripheral circuit region PE2. From among the plurality of second transistors TR2, the second transistor TR2 included in the page buffer 34 may be connected to the bonding structure BS through the plurality of upper conductive plugs 226 and the plurality of upper conductive lines 228.

In some example embodiments, the first peripheral circuit region PE1 may include a plurality of transistor regions, which are divided according to operating voltages of the plurality of first transistors TR1, and the second peripheral circuit region PE2 may include a plurality of transistors, which are divided according to operating voltages of the plurality of second transistors TR2. In some example embodiments, the plurality of transistor regions may include a region including low-voltage transistors having relatively low operating voltages of about 1.0 V to about 10 V (e.g. a threshold voltage of about 1.0 V to about 10 V in absolute value) and a region including high-voltage transistors having relatively high operating voltages higher than about 10 V (e.g. a threshold voltage of greater than about 10 V in absolute value). In some example embodiments, the operating voltage of each of the plurality of first transistors TR1 included in the first peripheral circuit region PE1 may be different from the operating voltage of each of the plurality of second transistors TR2 included in the second peripheral circuit region PE2. For example, an oxide thickness of each MOS transistor included in the first peripheral circuit region PE1 may be different, e.g. may be thicker, than an oxide thickness of each MOS transistor included in the second peripheral circuit region PE2. Alternatively or additionally, a gate length of each MOS transistor included in the first peripheral circuit region PE1 may be different, e.g. may be longer, than a gate length of each MOS transistor included in in the second peripheral circuit region PE2.

In the plurality of first and second transistors TR1 and TR2 included in the first peripheral circuit region PE1 and the second peripheral circuit region PE2, a low-voltage transistor that requires or uses a high-speed operation may include the data I/O circuit 36 described above with reference to FIG. 1. Circuits included in the peripheral circuit 30 described above with reference to FIG. 1 may include the plurality of first and second transistors TR1 and TR2 included in the first peripheral circuit region PE1 and the second peripheral circuit region PE2, and some transistors of the plurality of first and second transistors TR1 and TR2 may be or correspond to high-voltage transistors. The high-voltage transistors may be transistors configured to generate and/or transmit high voltages and include, for example, the row decoder 32, the page buffer 34, and the CSL driver 39, which are described above with reference to FIG. 1. In some example embodiments, the row decoder 32 shown in FIG. 1 may include a high-voltage switch configured to receive a high voltage higher than a power supply voltage from the outside. For example, a high voltage of about 20 V or 20 V in absolute value may be used during a program operation or an erase operation on memory cells included in the memory cell array 20 shown in FIG. 1. To control the high voltage, the high voltage may be provided from the outside to the high-voltage switch. The row decoder 32 may include the plurality of first transistors TR1 included in the first peripheral circuit region PE1 and the plurality of second transistors TR2 included in the second peripheral circuit region PE2.

Some of the plurality of gate lines 130 in the cell region CELL may be connected to the second transistor TR2 of the row decoder 32 located in the second peripheral circuit region PE2 through the conductive pad region 112, the first contact structure CTS1, and the bonding structure BS. The others of the plurality of gate lines 130 in the cell region CELL may be connected to the first transistor TR1 of the row decoder 32 located in the first peripheral circuit region PE1 through the conductive pad region 112 and the second contact structure CTS2.

An operating voltage, e.g. a threshold voltage, of transistors included in the first peripheral circuit region PE1 may be determined by at least one of a gate length, an effective oxide thickness, or a dopant concentration included in or near a channel of the transistor or a pocket area of the transistor. An operating voltage, e.g. a threshold voltage, of transistors included in the second peripheral circuit region PE2 may be determined by at least one of a gate length, an effective oxide thickness, or a dopant concentration included in or near a channel of the transistor or a pocket area of the transistor. At least one of a gate length, a dopant concentration, or an oxide thickness may be different between the transistors included in the first peripheral circuit region PE1 and the transistors included in the second peripheral circuit region PE2.

In the semiconductor device 100 described with reference to FIGS. 5A and 5B, some of the plurality of gate lines 130 included in the cell region CELL may be connected to the upper circuit CT2 included in the second peripheral circuit region PE2, and the others of the plurality of gate lines 130 may be connected to the lower circuit CT1 included in the first peripheral circuit region PE1. Accordingly, even when the stacked number of gate lines 130 in the cell region CELL is increased to improve the integration density of the semiconductor device 100 and the number of transistors to be formed in a peripheral circuit region is increased with the increase in the stacked number of gate lines 130, a degree of freedom for design for wirings may be improved in the semiconductor device 100, and/or a structure that is advantageous for high integration density and a reduction in planar size may be obtained.

In the semiconductor device 100 described with reference to FIGS. 5A and 5B, an example in which, from among the plurality of gate lines 130, some gate lines 130 are connected to the upper circuit CT2 included in the second peripheral circuit region PE2, and the other gate lines 130 are connected to the lower circuit CT1 included in the first peripheral circuit region PE1 has been described, but inventive concepts are not limited thereto. For example, the plurality of first transistors TR1 of the plurality of lower circuits CT1 included in the first peripheral circuit region PE1 may have a relatively low operating voltage of about 10 V or lower, or 10 V or lower in absolute value, and the plurality of second transistors TR2 of the plurality of upper circuits CT2 included in the second peripheral circuit region PE2 may have a relatively high operating voltage higher than about 10 V or 10 V in absolute value. In addition, some components of the cell region CELL may be electrically connectable to the plurality of first transistor TR1 included in the plurality of lower circuits CT1 in the first peripheral circuit region PE1, and other components of the cell region CELL may be electrically connectable to the plurality of second transistors TR2 included in the plurality of upper circuits CT2 in the second peripheral circuit region PE2.

In the semiconductor device 100 described with reference to FIGS. 5A and 5B, an example in which, from among the plurality of gate lines 130, some gate lines 130 adjacent to the first peripheral circuit region PE1 may be connected to the lower circuit CT1 included in the first peripheral circuit region PE1, and other gate lines 130 adjacent to the second peripheral circuit region PE2 are connected to the upper circuit CT2 included in the second peripheral circuit region PE2 has been described, but inventive concepts are not limited thereto. For example, from among the plurality of gate lines 130, some gate lines 130 adjacent to the first peripheral circuit region PE1 may be connected to the upper circuit CT2 included in the second peripheral circuit region PE2, and some gate lines adjacent to the second peripheral circuit region PE2 may be connected to the lower circuit CT1 included in the first peripheral circuit region PE1.

In some example embodiments, from among the plurality of gate lines 130, a plurality of gate lines 130, which constitute the plurality of word lines (refer to WL in FIG. 3), may be respectively connected to high-voltage transistors included in the plurality of upper circuits CT2 in the second peripheral circuit region PE2. The high-voltage transistor may be a transistor having an operating voltage or threshold voltage more than about 10 V (e.g. 10 V in absolute value). From among the plurality of gate lines 130, a plurality of gate lines 130, which constitute the string selection line (refer to SSL in FIG. 3) and the ground selection line (refer to GSL in FIG. 3), may be respectively connected to low-voltage transistors included in the plurality of lower circuits CT1 in the first peripheral circuit region PE1. The low-voltage transistor may be or correspond to a transistor having an operating voltage, which is selected in a range of about 0.5 V to about 10 V or about 0.5 V in absolute value to about 10 V in absolute value.

In some example embodiments, from among the plurality of gate lines 130, the plurality of gate lines 130, which constitute the plurality of word lines (refer to WL in FIG. 3), may be respectively connected to high-voltage transistors included in the plurality of lower circuits CT1 in the first peripheral circuit region PE1. From among the plurality of gate lines 130, the plurality of gate lines 130, which constitute the string selection line (refer to SSL in FIG. 3) and the ground selection line (refer to GSL in FIG. 3), may be respectively connected to low-voltage transistors included in the plurality of upper circuits CT2 in the second peripheral circuit region PE2.

Figure 7:
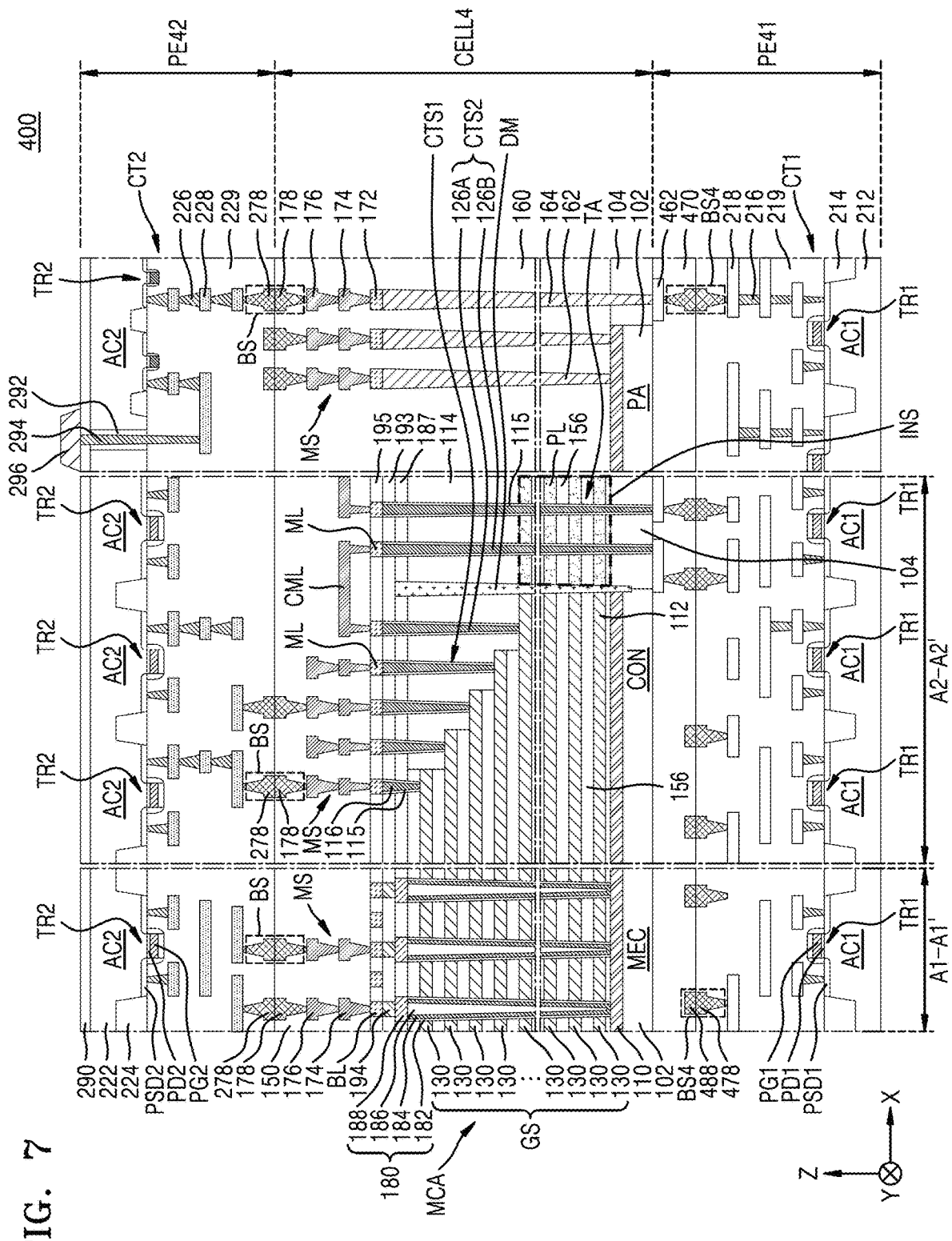
FIG. 7 is a cross-sectional view of a semiconductor device according to some example embodiments.

FIG. 7 is a cross-sectional view of a semiconductor device 400 according to some example embodiments. In FIG. 7, the same reference numerals are used to denote the same elements as in FIGS. 5A and 5B, and repeated descriptions thereof will be omitted.

Referring to FIG. 7, the semiconductor device 400 may have substantially the same configuration as the semiconductor device 100 described with reference to FIGS. 5A and 5B. However, the semiconductor device 400 may include a first peripheral circuit region PE41, a cell region CELL4, and a second peripheral circuit region PE42. The first peripheral circuit region PE41, the cell region CELL4, and the second peripheral circuit region PE42 may respectively have substantially the same configurations as the first peripheral circuit region PE1, the cell region CELL, and the second peripheral circuit region PE2 described with reference to FIGS. 5A and 5B. However, the first peripheral circuit region PE41 and the cell region CELL4 may be bonded to each other by using a plurality of bonding structures BS4 and form a C2C structure.

The first peripheral circuit region PE41 may have substantially the same configuration as the first peripheral circuit region PE1 described with reference to FIG. 5B. However, the first peripheral circuit region PE41 may further include a plurality of first bonding metal pads 478 connected to a lower conductive line 218 located at an uppermost layer, from among a plurality of lower conductive lines 218. The plurality of first bonding metal pads 478 may be insulated from each other by a first interlayer insulating film 219.

The cell region CELL4 may have substantially the same configuration as the cell region CELL described with reference to FIGS. 5A and 5B. However, the cell region CELL4 may include a plurality of backside conductive lines 462 formed on a lower surface of a cell substrate 102, a backside insulating film 470 covering the plurality of backside conductive lines 462 on the lower surface of the cell substrate 102, and a plurality of second bonding metal pads 488, which partially pass through the backside insulating film 470 and constitute a lowermost metal layer of the cell region CELL4. Some of the plurality of second bonding metal pads 488 may be connected, e.g. directly connected, to one selected from the plurality of backside conductive lines 462.

The plurality of bonding structures BS4 may be a resultant structure obtained by bonding a plurality of first bonding metal pads 478 formed in an uppermost metal layer of the first peripheral circuit region PE41 to a plurality of second bonding metal pads 488 formed in the lowermost metal layer of the cell region CELL4.

For example, a first chip including the first peripheral circuit region PE41 formed on a first wafer may be manufactured/fabricated, and a second chip including the cell region CELL4 formed on a second wafer, which is different from the first wafer, may be manufactured/fabricated. Thereafter, the first chip and the second chip may be connected to each other by a bonding technique to form the plurality of bonding structures BS4. As a result, the first peripheral circuit region PE41 and the cell region CELL4 may be bonded to each other by using the plurality of bonding structures BS4 and form a C2C structure.

A second contact plug 126B may pass through the interlayer insulating film 195, the upper insulating film 193, the middle insulating film 187, the connection-unit insulating film 114, and an insulating island INS in a through electrode area TA, pass through an insulating plug 104, and extend to the backside conductive line 462. A lower end of the second contact plug 126B may be in contact with the backside conductive line 462. The second contact plug 126B may be connected to the lower conductive line 218, which is included in the first peripheral circuit region PE41, through the backside conductive line 462 and the bonding structure BS4 and connected to a lower circuit CT1 located in the first peripheral circuit region PE41.

In the cell region CELL4, a connection contact plug 164 may pass through an interlayer insulating film 160 and the insulating plug 104 and extend to one selected from the backside conductive lines 462 in a vertical direction (Z direction). The connection contact plug 164 may be connected to the lower conductive line 218, which is included in the first peripheral circuit region PE41, through the backside conductive line 462 and the bonding structure BS4 and connected to the lower circuit CT1 located in the first peripheral circuit region PE41.

Figure 8:
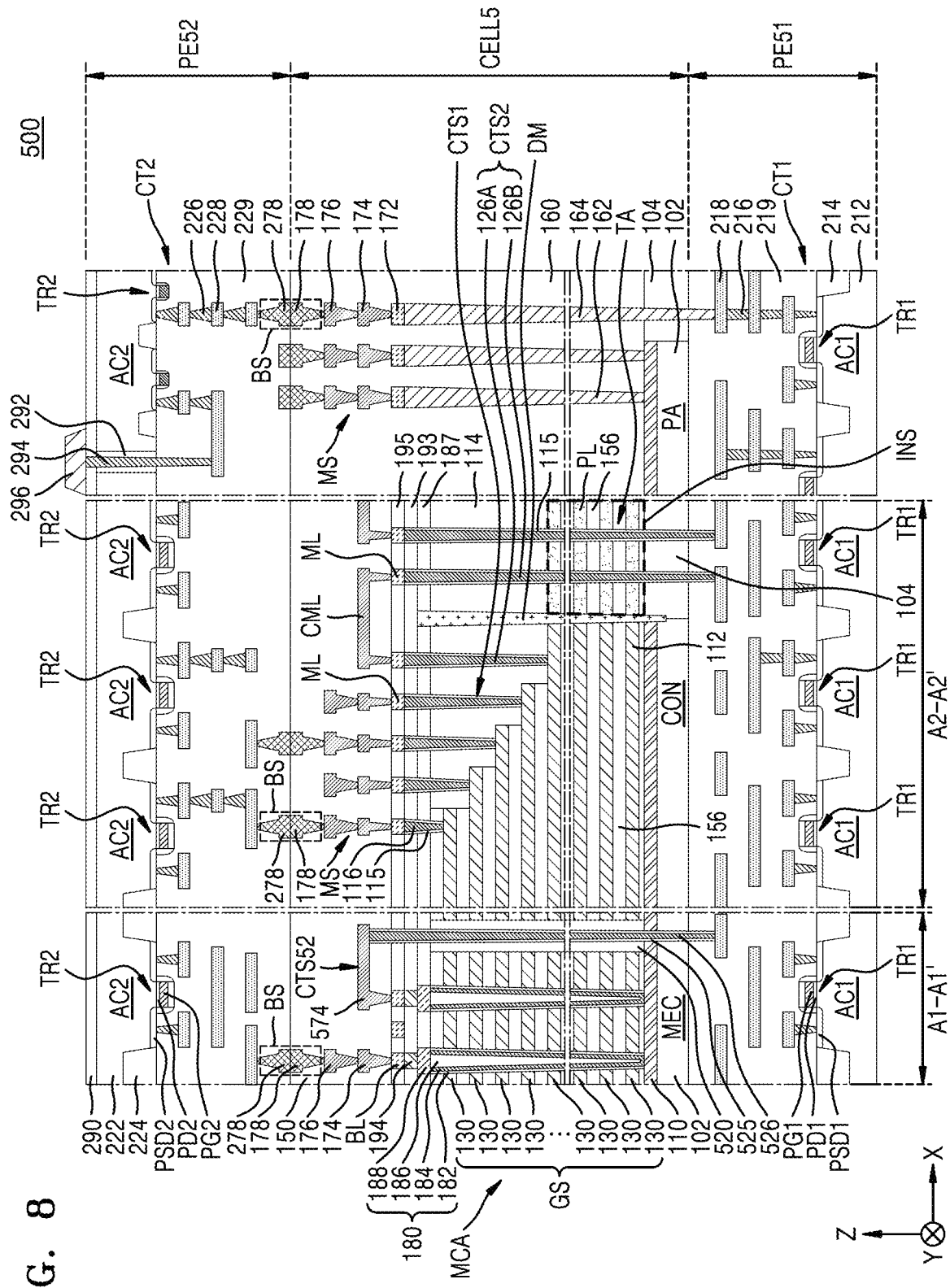
FIG. 8 is a cross-sectional view of a semiconductor device according to some example embodiments.

FIG. 8 is a cross-sectional view of a semiconductor device 500 according to some example embodiments. In FIG. 8, the same reference numerals are used to denote the same elements as in FIGS. 5A and 5B, and repeated descriptions thereof will be omitted.

Referring to FIG. 8, the semiconductor device 500 may have substantially the same configuration as the semiconductor device 100 described with reference to FIGS. 5A and 5B. However, the semiconductor device 500 may include a first peripheral circuit region PE51, a cell region CELL5, and a second peripheral circuit region PE52 The first peripheral circuit region PE51, the cell region CELL5, and the second peripheral circuit region PE52 may respectively have substantially the same configurations as the first peripheral circuit region PE1, the cell region CELL, and the second peripheral circuit region PE2 described with reference to FIGS. 5A and 5B. However, from among a plurality of bit lines BL included in the cell region CELL of the semiconductor device 500, some or at least one bit lines BL may be connected to a lower circuit CT1 located in the first peripheral circuit region PE51 through a contact structure CTS52, and other bit lines BL may be connected to an upper circuit CT2 located in the second peripheral circuit region PE52 in a similar manner to that described with reference to FIG. 5B.

For example, the cell region CELL5 of the semiconductor device 500 may include an insulating structure 520 located on a conductive plate 110 in a memory cell region MEC, a contact plug 526 that passes through the insulating structure 520 and extends in a vertical direction (Z direction), and a connection wiring layer 574 at the same level as a plurality of first upper wiring layers 174. The contact plug 526 and the connection wiring layer 574 may constitute or correspond to the contact structure CTS52 configured to connect the bit line BL to the lower circuit CT1 located in the first peripheral circuit region PE1. The insulating structure 520 may pass through a plurality of gate lines 130 and a plurality of insulating films 156, which constitute a gate stack GS, and extend in the vertical direction (Z direction) on the memory cell region MEC. In some example embodiments, the insulating structure 520 may include a silicon oxide film. In some example embodiments, the insulating structure 520 may have a multilayered structure in which a plurality of silicon oxide films and a plurality of silicon nitride films are alternately stacked one by one. An upper surface of the insulating structure 520 may be covered by a middle insulating film 187. A dam structure (not shown) configured to surround the insulating structure 520 may be further provided in a similar manner to a dam structure DM configured to surround a through electrode area TA located on a connection region CON. The insulating structure 520 may be apart from the plurality of gate lines 130 with the dam structure therebetween in a lateral direction.

The contact plug 526 may pass through the insulating structure 520, the conductive plate 110, and a cell substrate 102 and extend into the first peripheral circuit region PE51. A sidewall of the contact plug 526 may be surrounded by an insulating plug 525. An upper end of the contact plug 526 may be connected to the connection wiring layer 574 located at the same level as the plurality of first upper wiring layers 174, while a lower end of the contact plug 526 may be connected to a lower conductive line 218 included in the first peripheral circuit region PE51. A partial region of the contact plug 526 may be surrounded by a first interlayer insulating film 219 in the first peripheral circuit region PE51. The contact plug 526 may include tungsten, titanium, tantalum, copper, aluminum, titanium nitride, tantalum nitride, tungsten nitride, or a combination thereof. The insulating plug 525 may include silicon nitride film, silicon oxide film, or a combination thereof.

According to the semiconductor device 500 described with reference to FIG. 8, in the cell region CELL5, the plurality of gate lines 130 may include the gate line 130 connected to one lower circuit CT1 included in the first peripheral circuit region PE51 and the gate line 130 connected to one upper circuit CT2 included in the second peripheral circuit region PE52. In addition, the plurality of bit lines BL may include the bit line BL connected to another lower circuit CT1 included in the first peripheral circuit region PE51 and the bit line BL connected to another upper circuit CT2 included in the second peripheral circuit region PE52. Accordingly, even when the stacked number of gate lines 130 in the cell region CELL5 is increased to improve the integration density of the semiconductor device 500 and the number of bit lines BL is increased, a degree of freedom for design for wirings may be improved in the semiconductor device 500, and a structure that is advantageous for high integration density and/or a reduction in planar size may be obtained.

Figure 9:
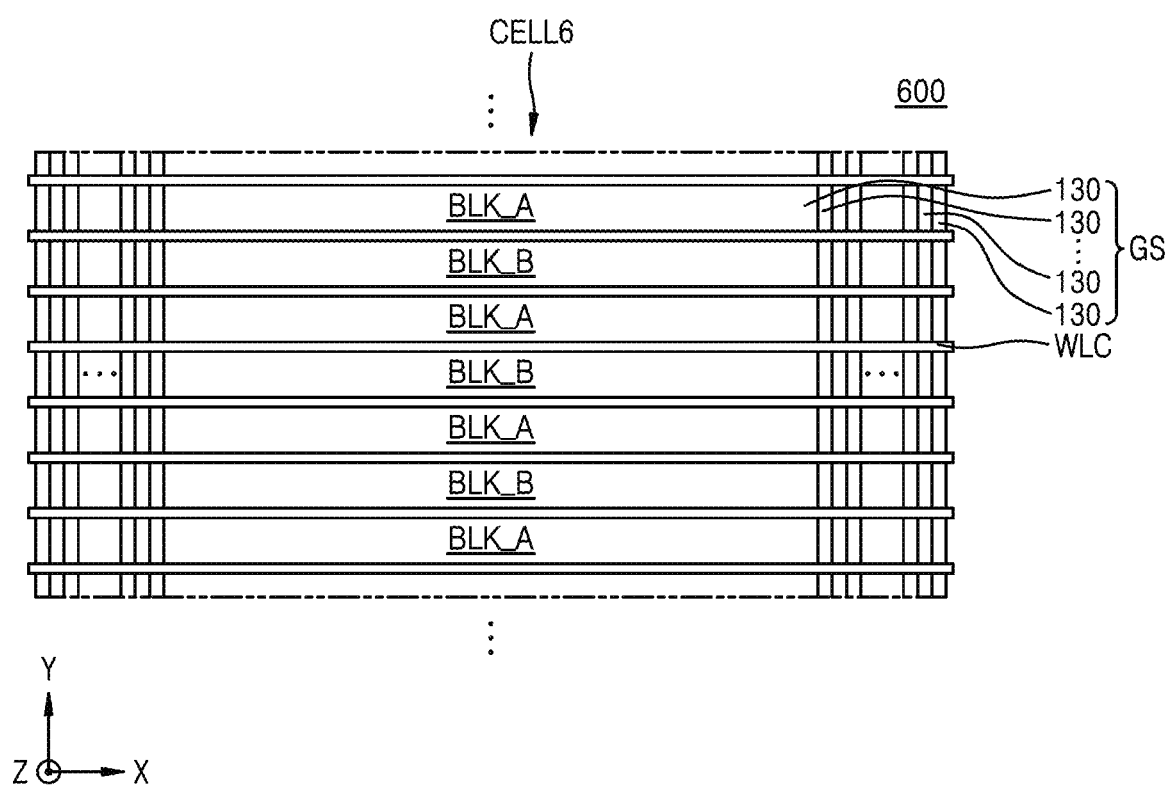
FIG. 9 is a plan view of a semiconductor device according to some example embodiments.
Figure 10A:
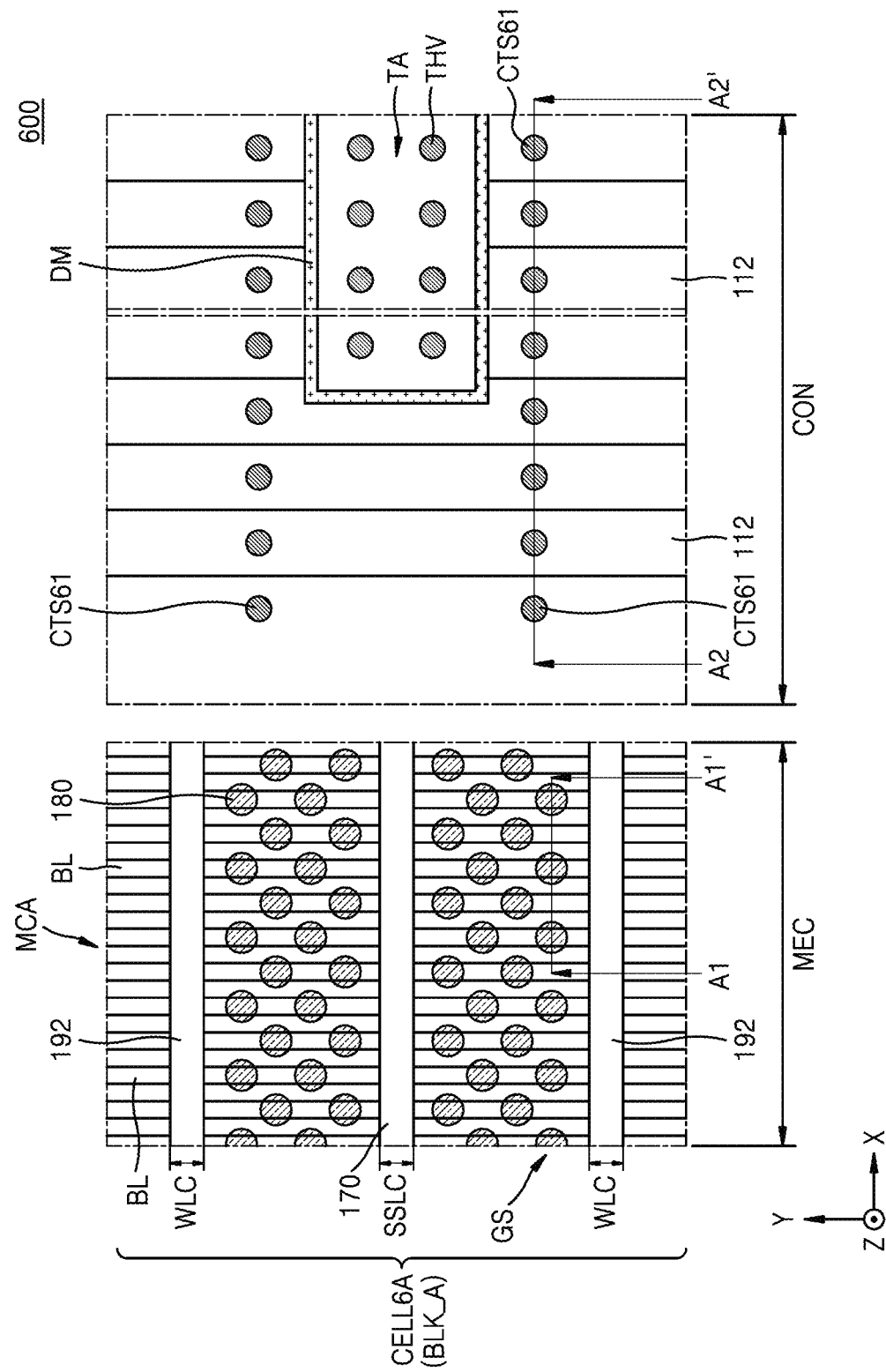
FIG. 10A illustrates a plan layout of components in a partial region of a first memory cell block shown in FIG. 9.
Figure 10B:
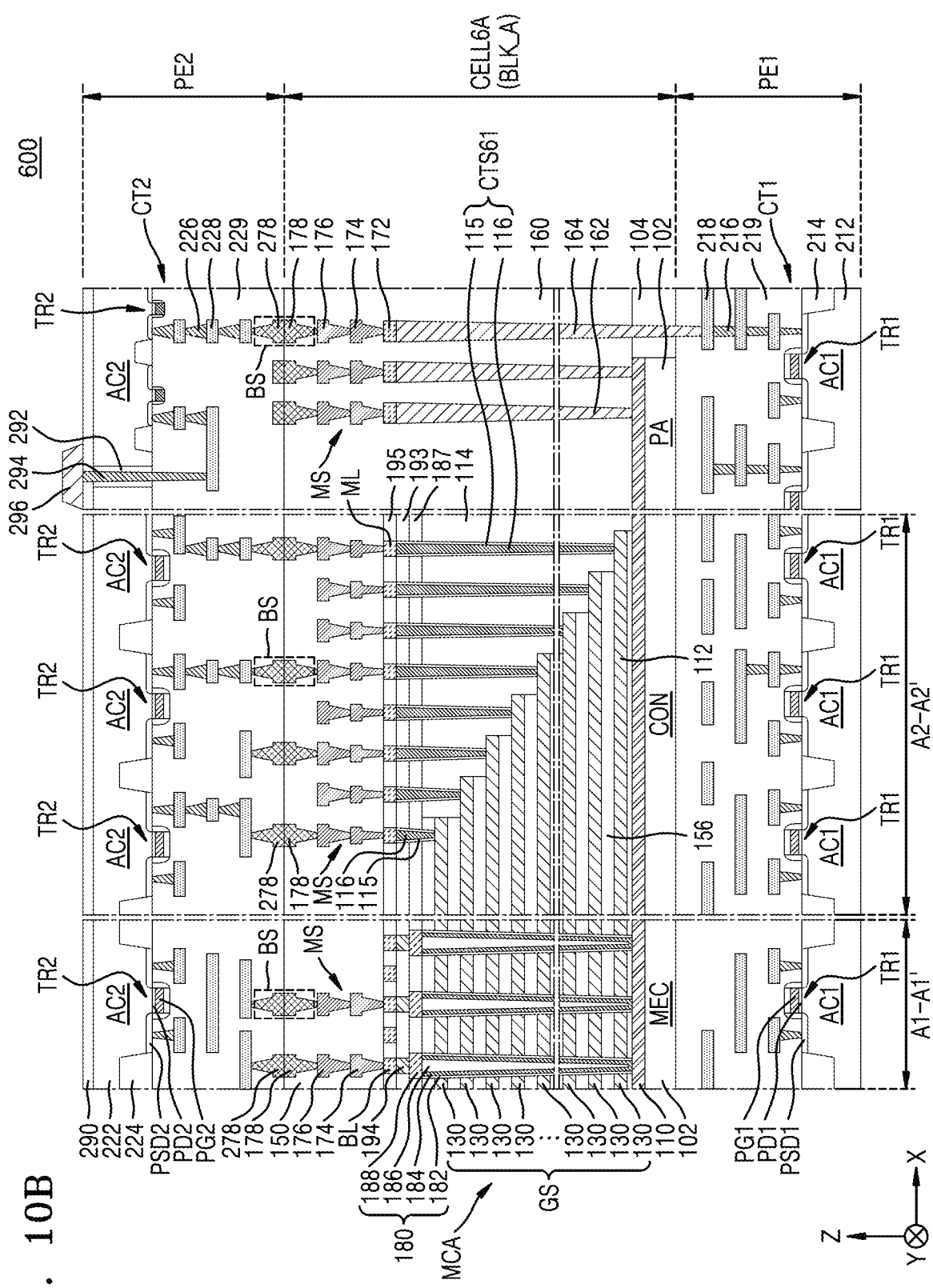
FIG. 10B is a cross-sectional view of the components in the partial region of the first memory cell block shown in FIG. 9.
Figure 11A:
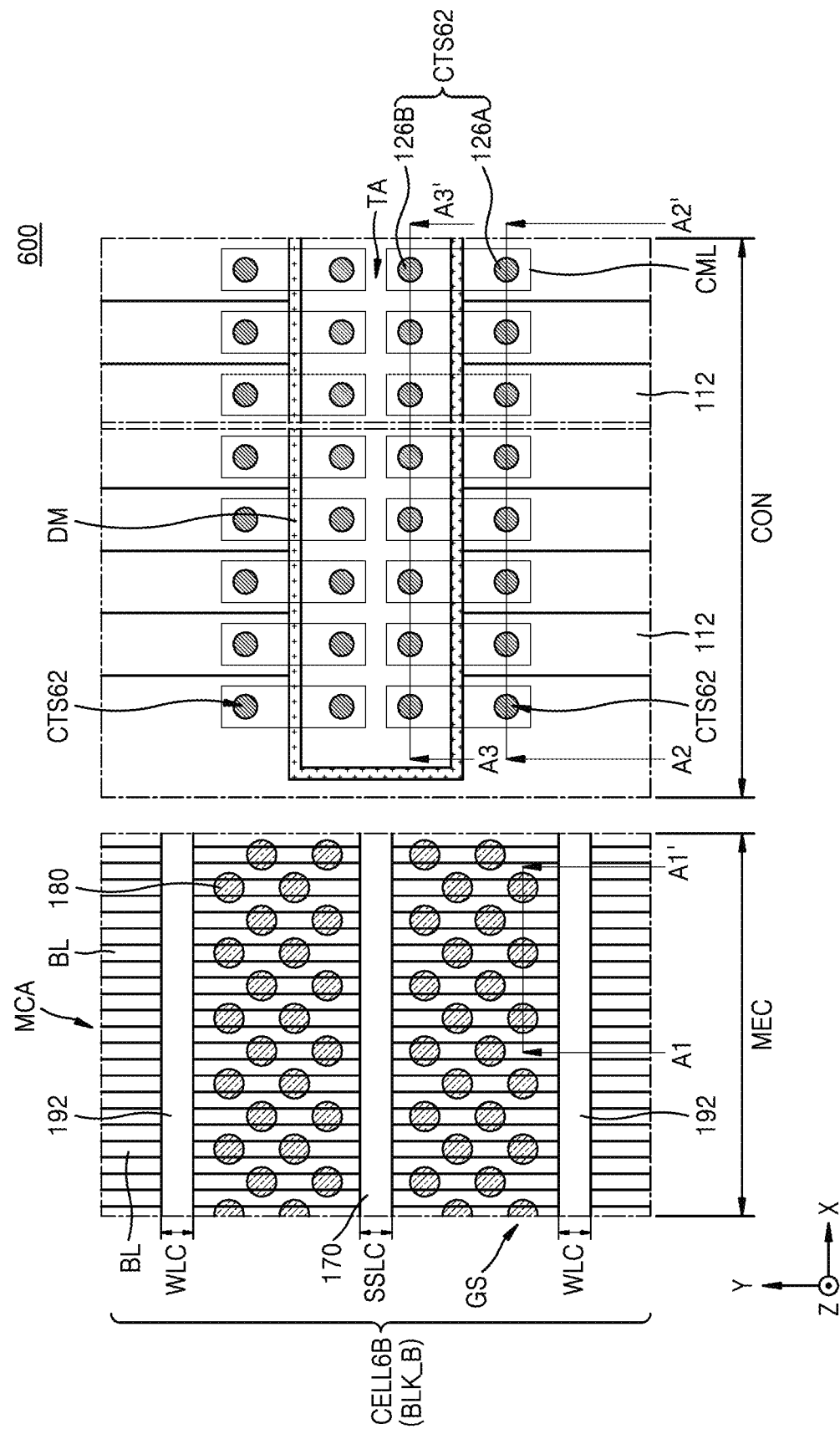
FIG. 11A illustrates a plan layout of components in a partial region of a second memory cell block shown in FIG. 9.
Figure 11B:
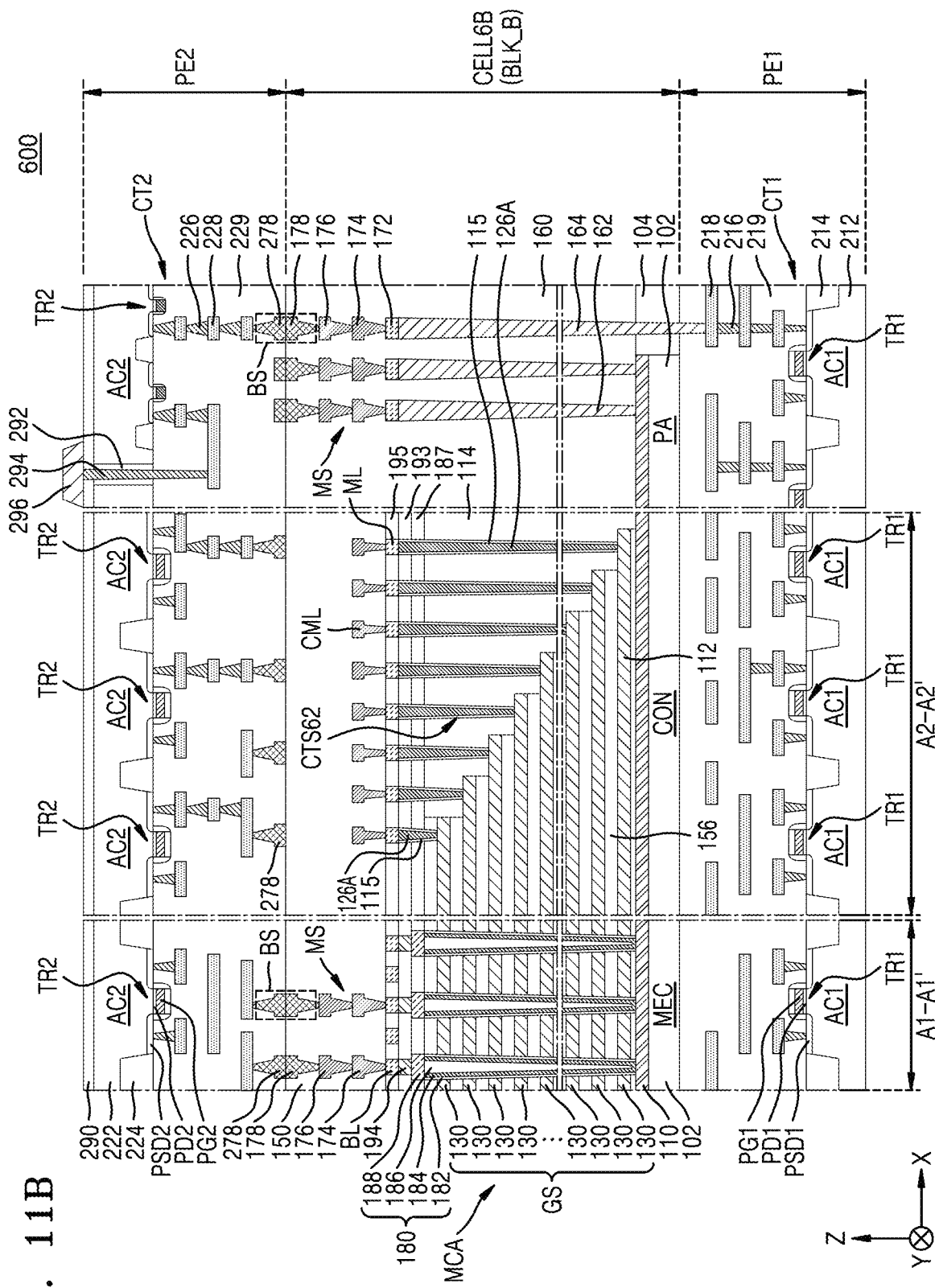
FIGS. 11B and 11C are cross-sectional views of the components in the partial region of the second memory cell block shown in FIG. 9.
Figure 11C:
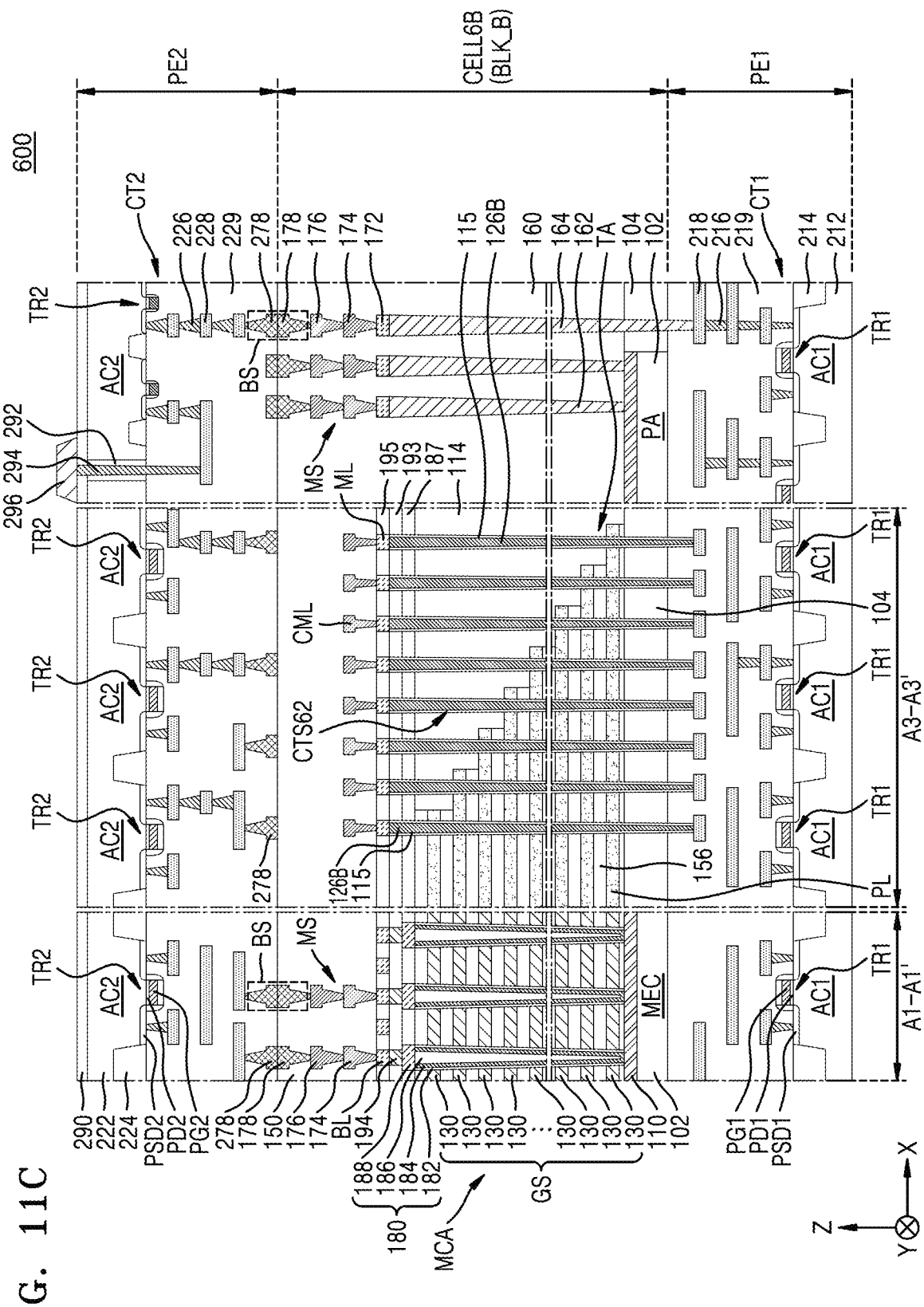

FIGS. 9 to 11C are diagrams of a semiconductor device 600 according to some example embodiments. More specifically, FIG. 9 is a plan view of a plurality of memory cell blocks (e.g., BLK_A and BLK_B) included in a cell region CELL6 of the semiconductor device 600. FIG. 10A illustrates a plan layout of components in a partial region of a first memory cell block BLK_A of the plurality of memory cell blocks (e.g., BLK_A and BLK_B) shown in FIG. 9, and FIG. 10B is a cross-sectional view of the components in the partial region of the first memory cell block BLK_A. FIG. 11A illustrates a plan layout of components in a partial region of a second memory cell block BLK_B of the plurality of memory cell blocks (e.g., BLK_A and BLK_B) shown in FIG. 9, FIG. 11B is a cross-sectional view of the components in the partial region of the second memory cell block BLK_B, and FIG. 11C is a cross-sectional view of components in another partial region of the second memory cell block BLK_B.

In FIGS. 9 to 11C, the same reference numerals are used to denote the same elements as in FIGS. 5A and 5B, and repeated descriptions thereof will be omitted.

Referring to FIGS. 9 to 11C, the cell region CELL6 of the semiconductor device 600 may include a plurality of memory cell blocks (e.g., BLK_A and BLK_B) including a first memory cell block BLK_A and a second memory cell block BLK_B having different structures. The plurality of memory cell blocks (e.g., BLK_A and BLK_B) may be included in the plurality of memory cell blocks BLK1, BLK2, . . . , and BLKp described with reference to FIG. 2.

As shown in FIGS. 10A and 10B, the first memory cell block BLK_A may include a first cell region CELL6A, which is a portion of the cell region CELL6. In FIG. 10B, a configuration of a memory cell region MEC on the first cell region CELL6A may correspond to a cross-sectional configuration taken along line A1-A1' of FIG. 10A, and a configuration of the memory cell region MEC on a connection region CON may correspond to a cross-sectional configuration taken along line A2-A2' of FIG. 10A.

As shown in FIGS. 11A and 11C, the second memory cell block BLK_B may include a second cell region CELL6B, which is another portion of the cell region CELL6. In FIG. 11B, a configuration of the first cell region CELL6B on the memory cell region MEC may correspond to a cross-sectional configuration taken along line A1-A1' of FIG. 11A, and a configuration of the first cell region CELL6B on the connection region CON may correspond to a cross-sectional configuration taken along line A2-A2' of FIG. 11A. In FIG. 11C, a configuration of the first cell region CELL6B on the memory cell region MEC may correspond to a cross-sectional configuration taken along line A1-A1' of FIG. 11A, and a configuration of the first cell region CELL6B on the connection region CON may correspond to a cross-sectional configuration taken along line A3-A3' of FIG. 11A.

The first cell region CELL6A shown in FIGS. 10A and 10B may have substantially the same configuration as the cell region CELL of the semiconductor device 100 described with reference to FIGS. 5A and 5B. However, a plurality of first contact structures CTS61 may be on a plurality of conductive pad regions 112 in the first cell region CELL6A of the semiconductor device 600. Each of a plurality of gate lines 130 included in the first cell region CELL6A may be connected to an upper circuit CT2 included in a second peripheral circuit region PE2 through the conductive pad region 112 and the first contact structure CTS61. Each of the plurality of gate lines 130 included in the first cell region CELL6A may be connected to the upper circuit CT2 included in the second peripheral circuit region PE2 through the conductive pad region 112, the first contact structure CTS61, a wiring layer ML, a wiring structure MS, and a bonding structure BS. A detailed description of the plurality of first contact structures CTS61 may be the same as that of the first contact structure CTS1, which is presented with reference to FIG. 5B.

As shown in FIG. 10A, similar to the cell region CELL shown in FIG. 5A, a dam structure DM defining a through electrode area TA may be on the connection region CON of the first cell region CELL6A. In the through electrode area TA, a plurality of through electrodes THV may pass through respective partial regions of a connection-unit insulating film 114, the plurality of conductive pad regions 112, a plurality of insulating films 156, and a conductive plate 110, which are shown in FIG. 10B, and extend in a vertical direction (Z direction). In some example embodiments, each of the plurality of through electrodes THV in the through electrode area TA may not be connected to the conductive pad region 112.

The second cell region CELL6B shown in FIGS. 11A to 11C may have substantially the same configuration as the cell region CELL of the semiconductor device 100 described with reference to FIGS. 5A and 5B. However, a plurality of second contact structures CTS62 may be on the plurality of conductive pad regions 112 in the second cell region CELL6B of the semiconductor device 600.

As shown in FIGS. 11A and 11C, the dam structure DM defining the through electrode area TA may be on the connection region CON of the second cell region CELL6B. Detailed configurations of the dam structure DM and the through electrode area TA are substantially the same as those described with those described with reference to FIG. 5B. In the through electrode area TA defined by the dam structure DM, a plurality of second contact plugs 126B included in the plurality of second contact structures CTS62 may extend in the vertical direction (Z direction). Each of the plurality of second contact plugs 126B may be connected to a first contact plug 126A shown in FIGS. 11A and 11B through the wiring layer ML and a connection wiring layer CML, which are formed on an interlayer insulating film 195.

Each of the plurality of gate lines 130 included in the second cell region CELL6B may be connected to a lower circuit CT1 included in a first peripheral circuit region PE1 through the conductive pad region 112 and the second contact structure CTS62. A detailed configuration of the second contact structure CTS62 may be the same as that of the second contact structure CTS2, which is presented with reference to FIG. 5B.

Although FIG. 9 illustrates a configuration in which the first memory cell block BLK_A including the first cell region CELL6A and the second memory cell block BLK_B including the second cell region CELL6B are alternately arranged one by one in a second lateral direction (Y direction), inventive concepts are not limited thereto. For example, the semiconductor device 600 may include a first memory cell block group in which a plurality of first memory cell blocks BLK_A are consecutively arranged and/or a second memory cell block group in which a plurality of second memory cell blocks BLK_B are consecutively arranged.

According to the semiconductor device 600 described with reference to FIGS. 9 to 11C, each of the plurality of gate lines 130 may be connected to the upper circuit CT2 included in the second peripheral circuit region PE2 in the first memory cell block BLK_A selected from the plurality of memory cell blocks (e.g., BLK_A and BLK_B), and each of the plurality of gate lines 130 may be connected to the lower circuit CT1 included in the first peripheral circuit region PE1 in the second memory cell block BLK selected from the plurality of memory cell blocks (e.g., BLK_A and BLK_B). Accordingly, even when the stacked number of gate lines 130 in the cell region CELL6 is increased to improve the integration density of the semiconductor device 600, a degree of freedom for design for wirings may be improved in the semiconductor device 600, and/or a structure that is advantageous for high integration density and a reduction in planar size may be obtained.

Figure 12:
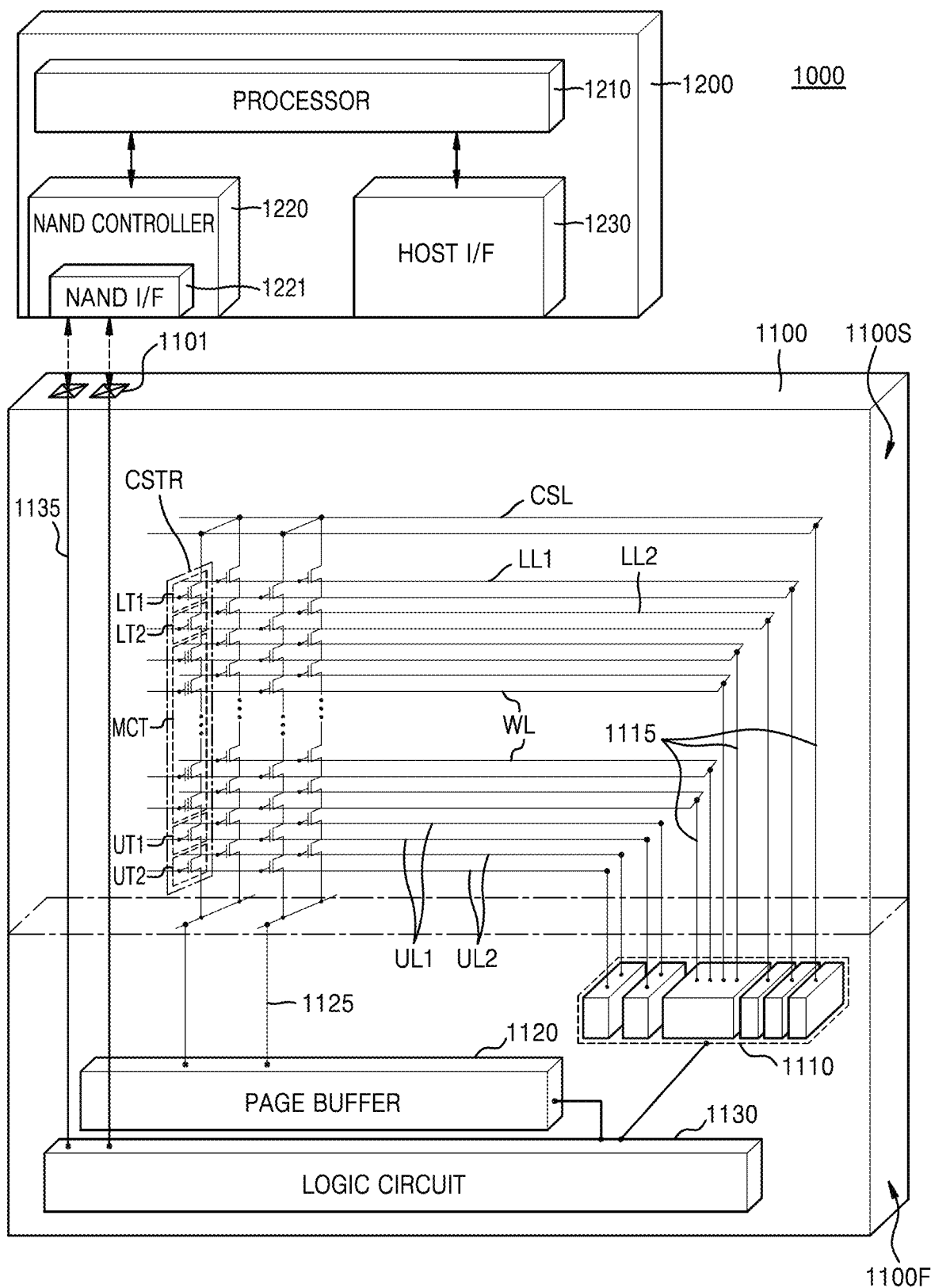
FIG. 12 is a schematic view of an electronic system including a semiconductor device, according to some example embodiments.

FIG. 12 is a schematic diagram of an electronic system 1000 including a semiconductor device 1100 according to some example embodiments.

Referring to FIG. 12, according to some example embodiments, the electronic system 1000 may include the semiconductor device 1100 and a controller 1200 electrically connected to the semiconductor device 1100. The electronic system 1000 may be or may include a storage device including at least one semiconductor device 1100 or an electronic device including the storage device. For example, the electronic system 1000 may be or may include at least one of a solid state drive (SSD) device, a universal serial bus (USB), a computing system, a medical device, or a communication device, which includes the at least one semiconductor device 1100.

The semiconductor device 1100 may be or may include a non-volatile memory device. For example, the semiconductor device 1100 may be a NAND flash memory device including at least one of structures of the semiconductor devices 10, 100, 400, 500, and 600, which are described above with reference to FIGS. 1 to 11C. The semiconductor device 1100 may include a first structure 1100F and a second structure 1100S on the first structure 1100F. In some example embodiments, the first structure 1100F may be beside the second structure 1100S. The first structure 1100F may be or may include a peripheral circuit structure including a decoder circuit 1110, a page buffer 1120, and a logic circuit 1130. The second structure 1100S may include a memory cell structure, which includes a bit line BL, a common source line CSL, a plurality of word lines WL, first and second gate upper lines (e.g., UL1 and UL2), first and second gate lower lines (e.g., LL1 and LL2), and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of lower transistors (e.g., LT1 and LT2) and the number of upper transistors (e.g., UT1 and UT2) may be variously modified according to some example embodiments.

In some example embodiments, the upper transistors UT1 and UT2 may include string selection transistors, and the lower transistors LT1 and LT2 may include ground selection transistors. A plurality of gate lower lines (e.g., LL1 and LL2) may be gate electrodes of the lower transistors LT1 and LT2, respectively. The word line WL may be or correspond to a gate electrode of the memory cell transistor MCT, and the gate upper lines UL1 and UL2 may be gate electrodes of the upper transistor UT1 and UT2.

The common source line CSL, the plurality of gate lower lines (e.g., LL1 and LL2), the plurality of word lines WL, and a plurality of gate upper lines (e.g., UL1 and UL2) may be electrically connected to the decoder circuit 1110 through a plurality of first connection wiring layers 1115 that extend to the second structure 1100S in the first structure 1100F. The plurality of bit lines BL may be electrically connected to the page buffer 1120 through a plurality of second connection wiring layers 1125 that extend to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The semiconductor device 1100 may communicate with the controller 1200 through an I/O pad 1101 electrically connected to the logic circuit 1130. The I/O pad 1101 may be electrically connected to the logic circuit 130 through an I/O connection wiring layer 1135 that extends to the second structure 1100S in the first structure 1100F.

The controller 1200 may include a processor 1210, a NAND controller 1220, and a host interface (or I/F) 1230. In some example embodiments, the electronic system 1000 may include a plurality of semiconductor devices 1100. In this case, the controller 1200 may control the plurality of semiconductor devices 1100.

The processor 1210 may control all operations of the electronic system 1000 included in the controller 1200. The processor 1210 may operate according to predetermined firmware, control the NAND controller 1220, and access the semiconductor device 1100. The NAND controller 1220 may include a NAND I/F 1221 configured to process communications with the semiconductor device 1100. A control command for controlling the semiconductor device 1100, data to be written to the plurality of memory cell transistors MCT of the semiconductor device 1100, and data to be read from the plurality of memory cell transistors MCT of the semiconductor device 1100 may be transmitted through the NAND I/F 1221. The host I/F 1230 may provide a communication function between the electronic system 1000 and an external host. When the control command is received from the external host through the host I/F 1230, the processor 1210 may control the semiconductor device 1100 in response to the control command.

Figure 13:
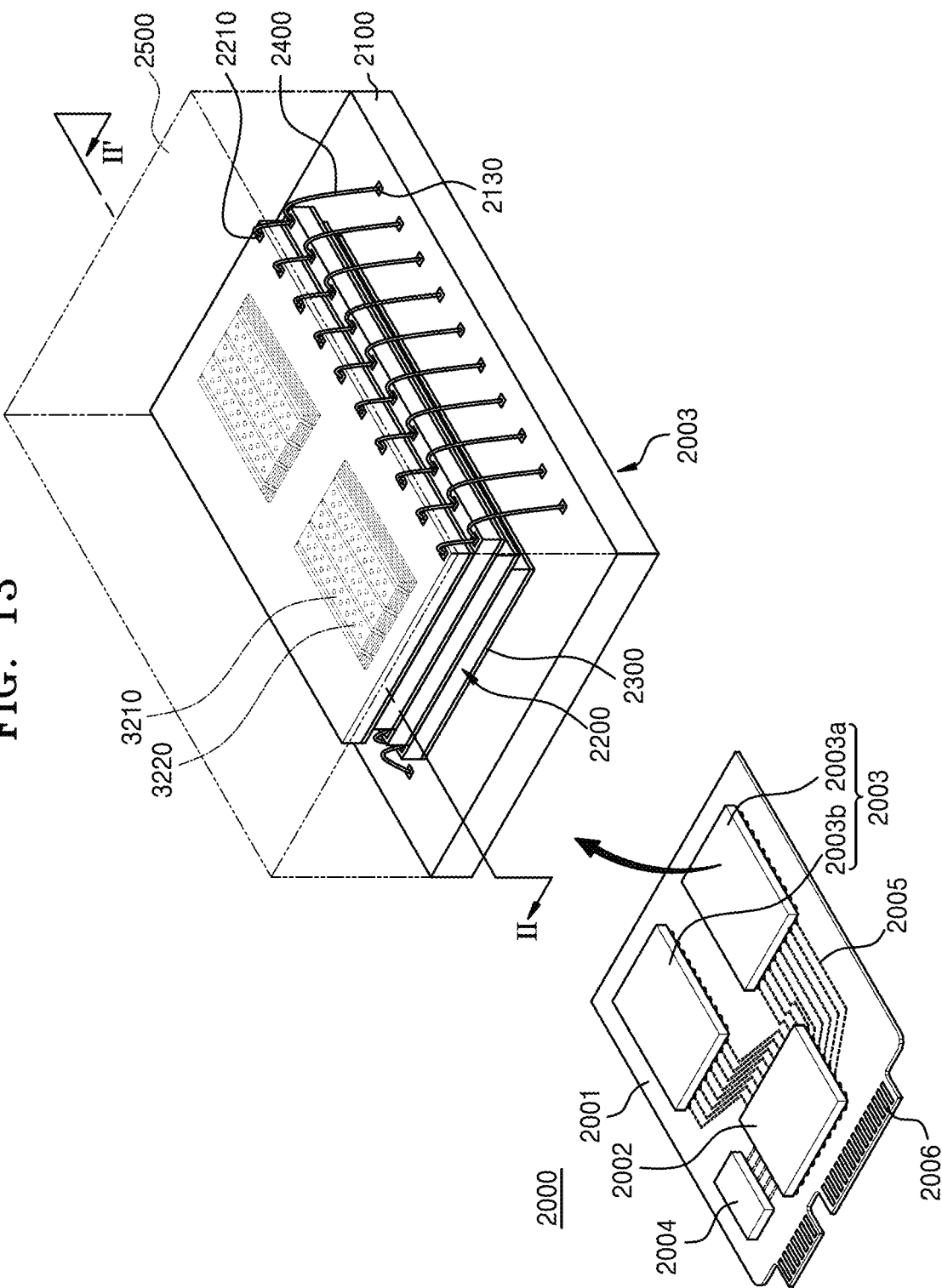
FIG. 13 is a schematic perspective view of an electronic system including a semiconductor device, according to some example embodiments.

FIG. 13 is a schematic perspective view of an electronic system 2000 including a semiconductor device, according to some example embodiments.

Referring to FIG. 13, according to some example embodiments, the electronic system 2000 may include a main substrate 2001, a controller 2002, at least one semiconductor package 2003, and dynamic random access memory (DRAM) 2004, which are mounted on the main substrate 2001. The semiconductor package 2003 and the DRAM 2004 may be connected to the controller 2002 by a plurality of wiring patterns 2005 formed in the main substrate 2001.

The main substrate 2001 may include a connector 2006 including a plurality of pins that are combined with an external host. The number and/or arrangement of pins in the connector 2006 may depend on a communication interface between the electronic system 2000 and the external host. In some example embodiments, the electronic system 2000 may communicate with the external host according to any one interface, such as USB, peripheral component interconnect express (PCI-E), serial advanced technology attachment (SATA), and M-Phy for universal flash storage (UFS). In some example embodiments, the electronic system 2000 may operate due to power supplied from the external host through the connector 2006. The electronic system 2000 may further include a power management integrated circuit (PMIC) configured to divide the power supplied from the external host between the controller 2002 and the semiconductor package 2003.

The controller 2002 may write data to the semiconductor package 2003 or read data from the semiconductor package 2003 and increase an operating speed of the electronic system 2000.

The DRAM 2004 may be or may correspond to a buffer memory configured to reduce a difference in speed between the semiconductor package 2003, which is a data storage space, and the external host. The DRAM 2004 included in the electronic system 2000 may operate as a kind of cache memory and provide a space for temporarily storing data during a control operation on the semiconductor package 2003. When the DRAM 2004 is included in the electronic system 2000, the controller 2002 may further include a DRAM controller configured to control DRAM 2004 in addition to a NAND controller configured to control the semiconductor package 2003.

The semiconductor package 2003 may include first and second semiconductor packages 2003a and 2003b, which are apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 on a lower surface of each of the plurality of semiconductor chips 2200, a connection structure 2400 configured to electrically connect the plurality of semiconductor chips 2200 to the package substrate 2100, and a molding layer 2500 covering the plurality of semiconductor chips 2200 and the connection structure 2400 on the package substrate 2100.

The package substrate 2100 may include a printed circuit board (PCB) including a plurality of package upper pads 2130. Each of the plurality of semiconductor chips 2200 may include an I/O pad 2210. The I/O pad 2210 may correspond to the I/O pad 1101 of FIG. 12. Each of the plurality of semiconductor chips 2200 may include a plurality of gate stacks 3210 and a plurality of channel structures 3220. Each of the plurality of semiconductor chips 2200 may include at least one of the semiconductor devices 10, 100, 400, 500, and 600 described with reference to FIGS. 1 to 11C.

In some example embodiments, the connection structure 2400 may be a bonding wire configured to electrically connect the I/O pad 2210 to the package upper pad 2130. Accordingly, in the first and second semiconductor packages 2003a and 2003b, the plurality of semiconductor chips 2200 may be electrically connected to each other by using a bonding wire technique and electrically connected to the package upper pad 2130 of the package substrate 2100. In some example embodiments, in the first and second semiconductor packages 2003a and 2003b, the plurality of semiconductor chips 2200 may be electrically connected to each other by a connection structure including TSVs instead of the connection structure 2400 for the bonding wire technique.

In some example embodiments, the controller 2002 and the plurality of semiconductor chips 2200 may be included in one package. In some example embodiments, the controller 2002 and the plurality of semiconductor chips 2200 may be mounted on an additional interposer substrate, which is different from the main substrate 2001, and the controller 2002 may be connected to the plurality of semiconductor chips 2200 by wirings formed in the interposer substrate.

Figure 14:
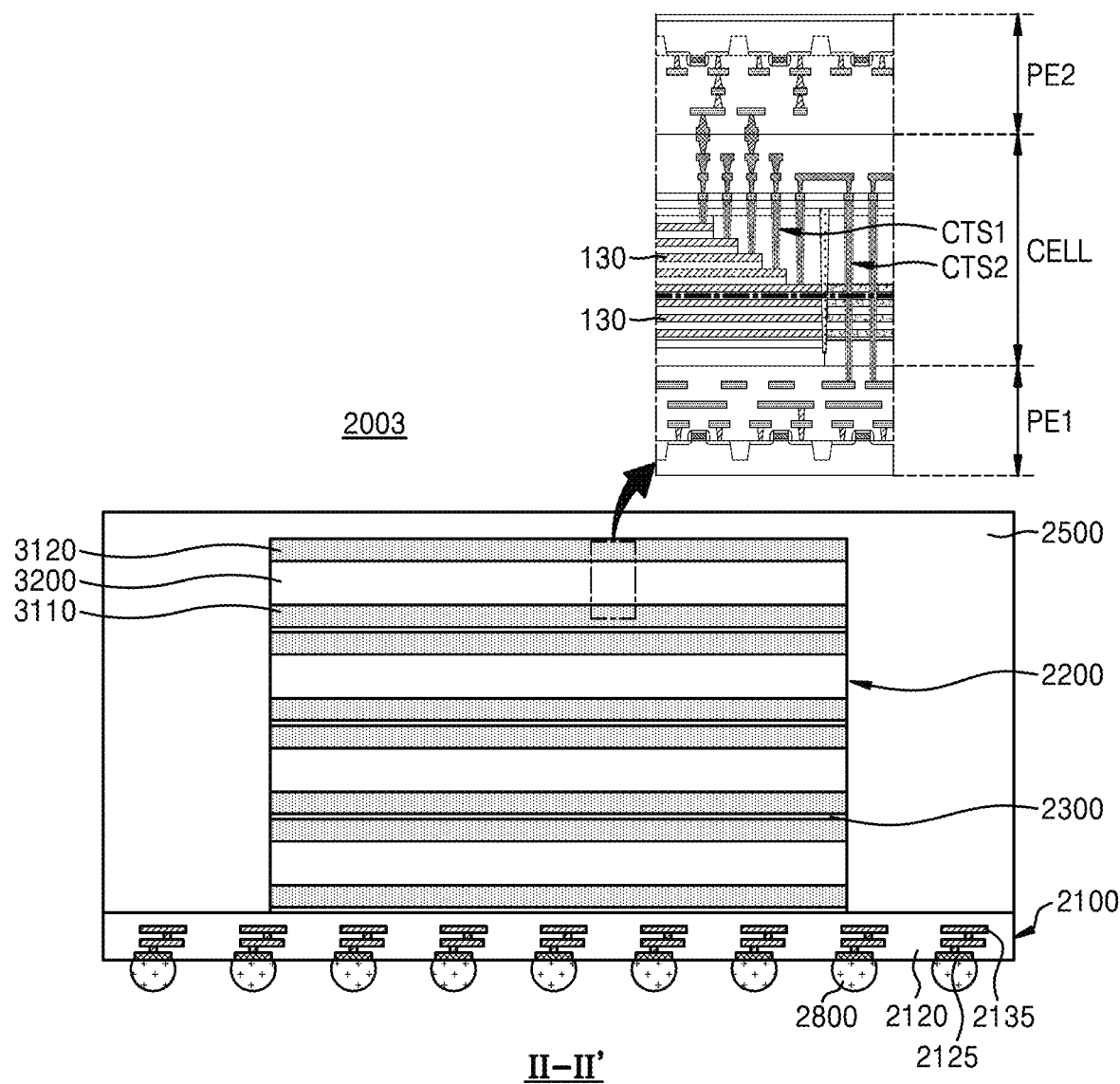
FIG. 14 is a schematic cross-sectional view of components of the electronic system, which is taken along line II-IT of FIG. 13.

FIG. 14 is a schematic cross-sectional view of a semiconductor package 2003 according to some example embodiments. FIG. 14 schematically illustrates a configuration of the semiconductor package 2003, which is taken along line II-II' of FIG. 13.

Referring to FIG. 14, in a semiconductor package 2003, a package substrate 2100 may be a PCB. The package substrate 2100 may include a package substrate body unit 2120, a plurality of package upper pads (refer to 2130 in FIG. 13) located on an upper surface of the package substrate body unit 2120, a plurality of lower pads 2125 located on a lower surface of the package substrate body unit 2120 or exposed at the lower surface of the package substrate body unit 2120, and a plurality of internal wirings 2135 configured to electrically connect the plurality of upper pads 2130 to the plurality of lower pads 2125 in the package substrate body unit 2120. As shown in FIG. 13, the plurality of upper pads 2130 may be electrically connected to a plurality of connection structures 2400. As shown in FIG. 14, the plurality of lower pads 2125 may be connected to a plurality of wiring patterns 2005 on the main substrate 2001 of the electronic system 2000 shown in FIG. 13, through a plurality of conductive connection units 2800.

Each of a plurality of semiconductor chips 2200 may include a first peripheral circuit region 3110, a cell region 3200, and a second peripheral circuit region 3120, which are sequentially stacked in a vertical direction and overlap each other in the vertical direction. In some example embodiments, the first peripheral circuit region 3110, the cell region 3200, and the second peripheral circuit region 3120 may respectively have substantially the same configurations as the first peripheral circuit region PE1, the cell region CELL, and the second peripheral circuit region PE2 described with reference to FIGS. 5A and 5B. However, inventive concepts are not limited thereto. For example, each of the plurality of semiconductor chips 2200 may include at least one of the structures of the semiconductor devices 10, 100, 400, 500, and 600, which are described with reference to FIGS. 1 to 11C.

FIGS. 15A to 15G are cross-sectional views of a process sequence of a method of manufacturing a semiconductor device, according to some example embodiments. In some example embodiments, a method of manufacturing the semiconductor device 100 shown in FIGS. 5A and 5B will be described as an example. In FIGS. 15A to 15G, a configuration of a cell region CELL on a memory cell region MEC may correspond to a configuration of a cross-sectional portion taken along line A1-A1' of FIG. 5A, according to a process sequence, and a configuration of the cell region CELL on a connection region CON may correspond to a configuration of a cross-sectional portion taken along line A2-A2' of FIG. 5A, according to a process sequence.

Figure 15A:
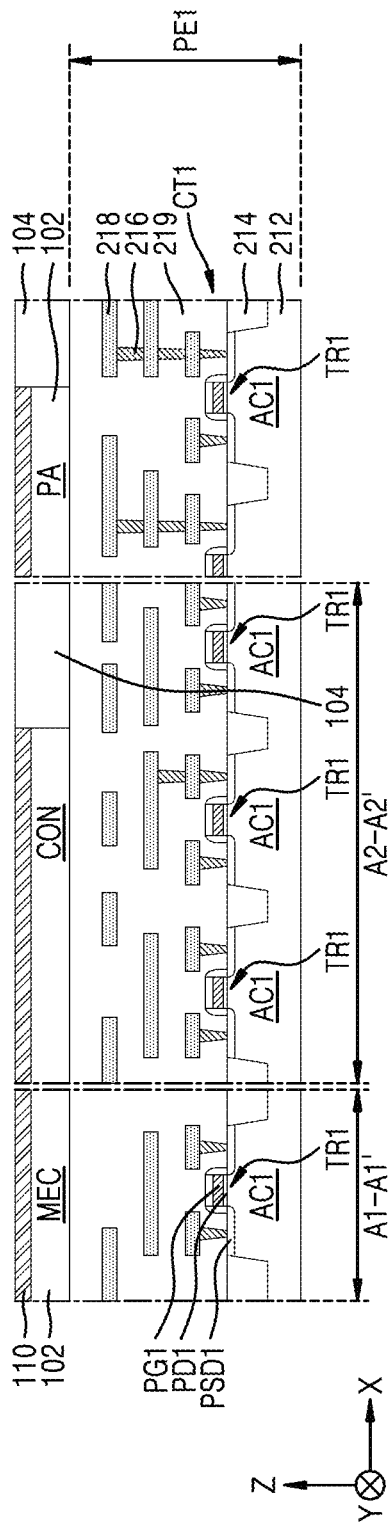
FIGS. 15A to 15G are cross-sectional views of a process sequence of a method of manufacturing a semiconductor device, according to some example embodiments.

Referring to FIG. 15A, a first peripheral circuit region PE1 including a first peripheral circuit substrate 212 and a plurality of lower circuits CT1 may be formed. The plurality of lower circuits CT1 may include a plurality of first transistors TR1, a plurality of lower conductive plugs 216, and a plurality of lower conductive lines 218.

A cell substrate 102 and a conductive plate 110 may be formed on the first peripheral circuit region PE1, and an insulating plug 104 may be formed to pass through a partial region of each of the cell substrate 102 and the conductive plate 110.

Figure 15B:
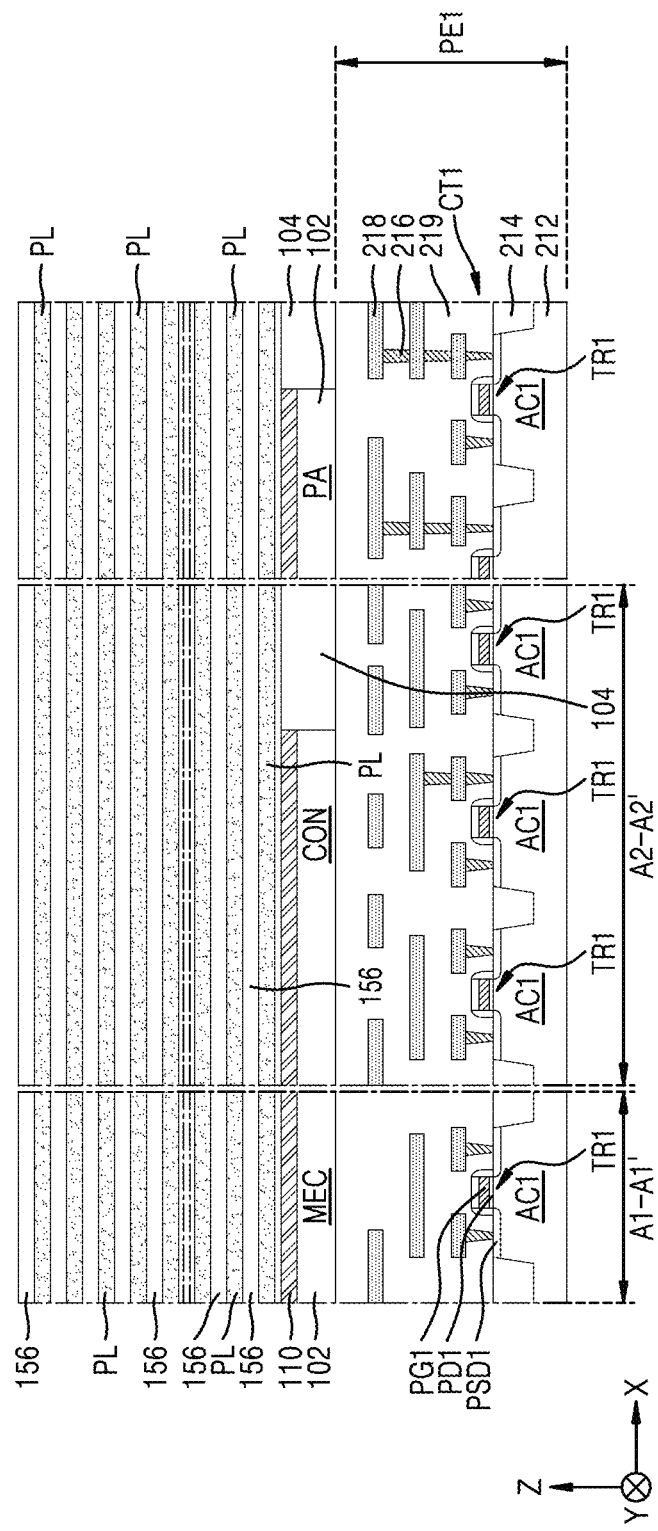

Referring to FIG. 15B, a plurality of insulating films 156 and a plurality of sacrificial insulating films PL may be alternately stacked one by one on the conductive plate 110 and a plurality of insulating plugs 104. The plurality of sacrificial insulating films PL may include a silicon nitride film. Each of the plurality of sacrificial insulating films PL may secure a space for forming a gate stack (refer to GS in FIG. 15D) during a subsequent process and fill a portion of a through electrode area TA defined by a dam structure DM.

Figure 15C:
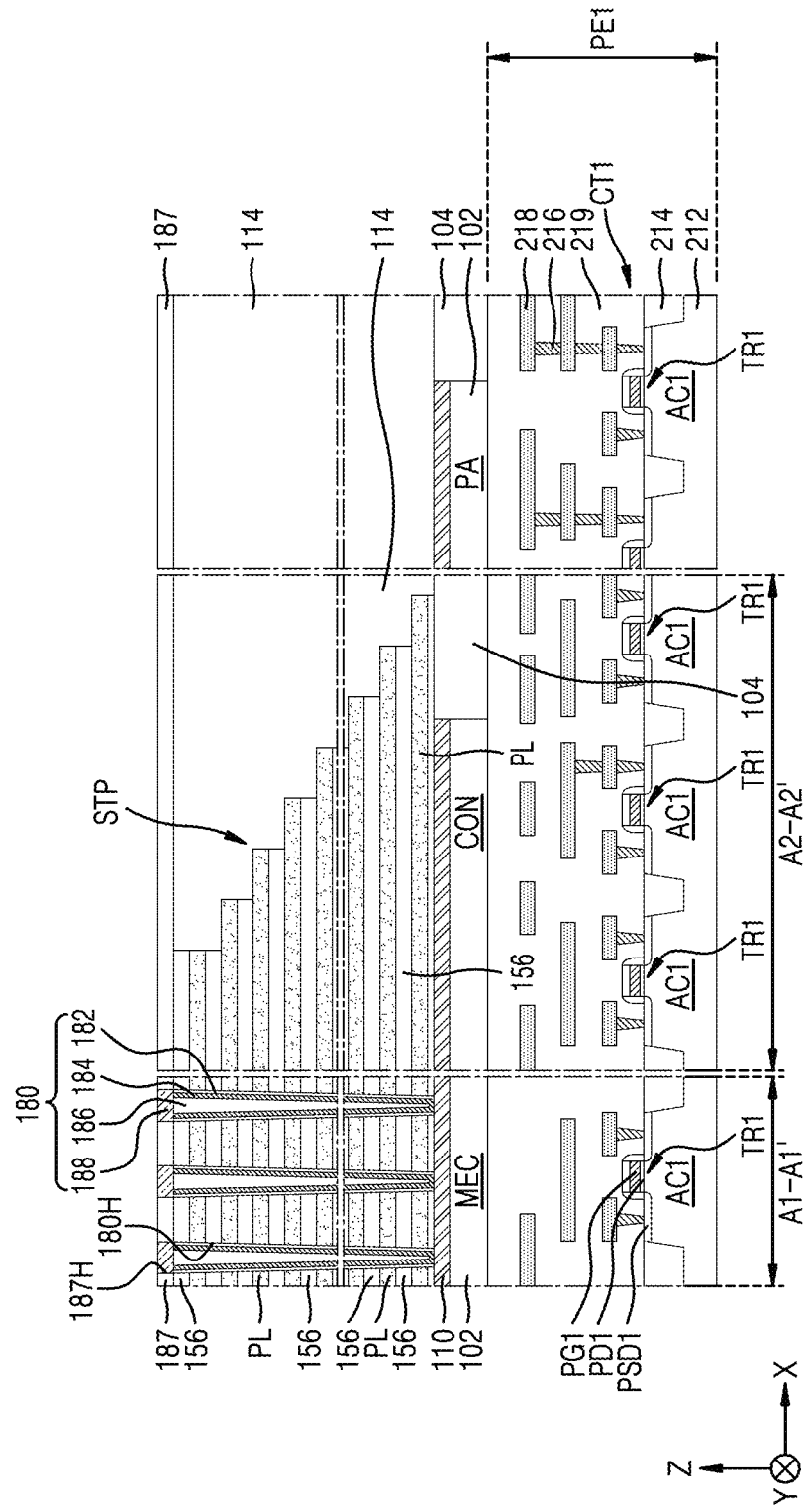

Referring to FIG. 15C, a portion of each of the plurality of insulating films 156 and the plurality of sacrificial insulating films PL may be removed on the connection region CON of the cell substrate 102 such that the plurality of insulating films 156 and the plurality of sacrificial insulating films PL form a step structure STP. Thereafter, a connection-unit insulating film 114 may be formed to cover the step structure STP. The connection-unit insulating film 114 may be formed to cover an upper surface of the conductive plate 110 and an upper surface of the insulating plug 104 adjacent to a pad bonding region PA, from among the plurality of insulating plugs 104.

A plurality of channel holes 180H may be formed on the memory cell region MEC of the cell substrate 102 to pass through the plurality of insulating films 156 and the plurality of sacrificial insulating films PL and extend in a vertical direction (Z direction). A gate dielectric film 182, a channel region 184, and a buried insulating film 186 may be formed inside each of the plurality of channel holes 180H to form a plurality of channel-hole filling structures.

Thereafter, a middle insulating film 187 may be formed on the memory cell region MEC, the connection region CON, and the pad bonding region PA to cover the plurality of channel-hole filling structures, the step structure STP, and the connection-unit insulating film 114. A plurality of contact holes 187H may be formed in the middle insulating film 187 to expose upper surfaces of the plurality of channel-hole filling structures, and a plurality of drain regions 188 may be formed inside the plurality of contact holes 187H to form channel structures 180. The middle insulating film 187 may be formed to have a planar upper surface.

Figure 15D:
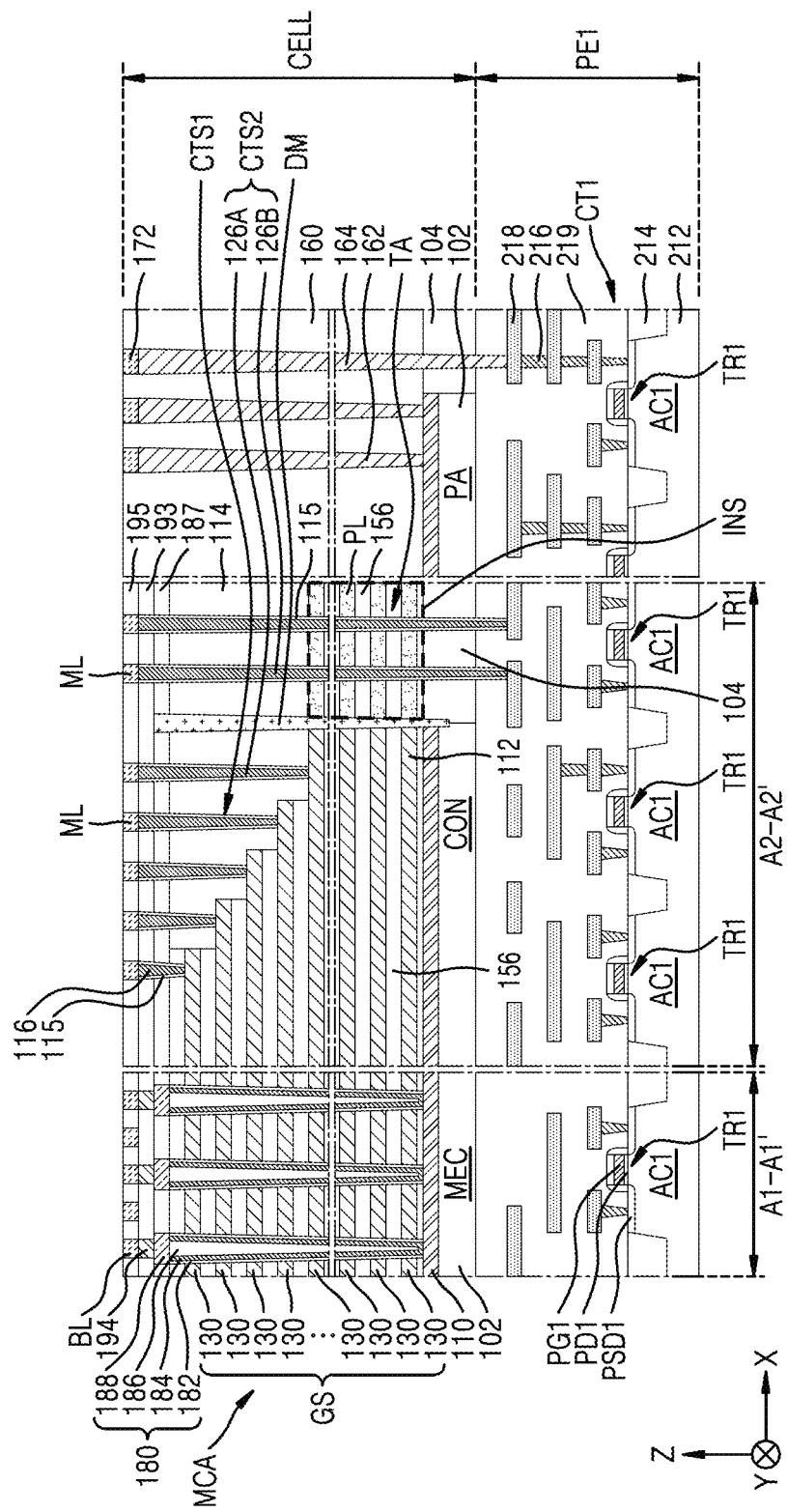

Referring to FIG. 15D, the plurality of word line cut regions (refer to WLC in FIG. 5A) and a dam hole for forming the dam structure DM may be formed in the resultant structure of FIG. 15C. Here, the plurality of word line cut regions may pass through the plurality of insulating films 156 and the plurality of sacrificial insulating films PL. Thereafter, the dam structure DM may be formed to fill the dam hole. Afterwards, the plurality of sacrificial insulating films PL may be replaced by a plurality of gate lines 130 and a plurality of conductive pad regions 112 due to the plurality of word line cut regions WLC. In this case, portions of the plurality of sacrificial insulating films PL in the through electrode area TA may be protected by the dam structure DM and remain unremoved. The plurality of insulating films 156 and the plurality of sacrificial insulating films PL, which remain in the through electrode area TA, may constitute an insulating island INS.

In some example embodiments, to replace the plurality of sacrificial insulating films (refer to PL in FIG. 15C) by the plurality of gate lines 130, the plurality of sacrificial insulating films (refer to PL in FIG. 15C) exposed through the plurality of word line cut regions (refer to WLC in FIG. 5A) may be selectively removed, and thus, empty spaces between the plurality of insulating films 156 may be provided. The empty spaces may be filled with a conductive material to form the plurality of gate lines 130 and the plurality of conductive pad regions 112.

Thereafter, as shown in FIG. 5A, the inside of each of the plurality of word line cut regions WLC may be filled with a word line cut structure 192.

An upper insulating film 193 may be formed on a plurality of channel structures 180, the dam structure DM, and the middle insulating film 187. Thereafter, a plurality of bit line contact pads 194 may be formed on the memory cell region MEC to pass through the upper insulating film 193 and be connected to the plurality of channel structures 180. The connection-unit insulating film 114, the middle insulating film 187, and the upper insulating film 193 may constitute an insulating structure.

Partial regions of the insulating structure may be anisotropically etched using a mask pattern (not shown) as an etch mask, and thus, a plurality of contact holes may be formed on each of the connection region CON and the pad bonding region PA. Some of the plurality of contact holes formed on the connection region CON may expose the plurality of conductive pad regions 112. The others of the plurality of contact holes formed on the connection region CON may pass through the insulating structure the insulating island INS, and the insulating plug 104, which are in the through electrode area TA, and portions of a first interlayer insulating film 219 in the first peripheral circuit region PE1 and expose the lower conductive lines 218.

Some of the plurality of contact holes formed on the pad bonding region PA may expose the conductive plate 110, and the others thereof may expose the lower conductive line 218 of the first peripheral circuit region PE1.

Afterwards, a plurality of insulating plugs 115, a plurality of contact plugs 116, a plurality of first contact plugs 126A, and a plurality of second contact plugs 126B may be formed inside the plurality of contact holes on the connection region CON to form a plurality of first contact structures CTS1 and a plurality of second contact structures CTS2. Also, a plurality of common source line contact plugs 162 and a connection contact plug 164 may be formed inside the plurality of contact holes the pad bonding region PA.

An interlayer insulating film 195 may be formed on the memory cell region MEC, the connection region CON, and the pad bonding region PA. Thereafter, a plurality of bit lines BL may be formed on the memory cell region MEC to pass through partial regions of the interlayer insulating film 195 and be connected to the plurality of bit line contact pads 194. A plurality of wiring layers ML may be formed on the connection region CON to pass through partial regions of the interlayer insulating film 195 and be connected to the plurality of contact plugs 116, the plurality of first contact plugs 126A, and the plurality of second contact plugs 126B. Wiring layers 172 may be formed on the pad bonding region PA to pass through partial regions of the interlayer insulating film 195 and be connected to the plurality of common source line contact plugs 162 and the connection contact plug 164. Insulating films filling spaces between conductive patterns on the pad bonding region PA and the insulating plug 104 adjacent thereto may be left as interlayer insulating films 160.

Figure 15E:
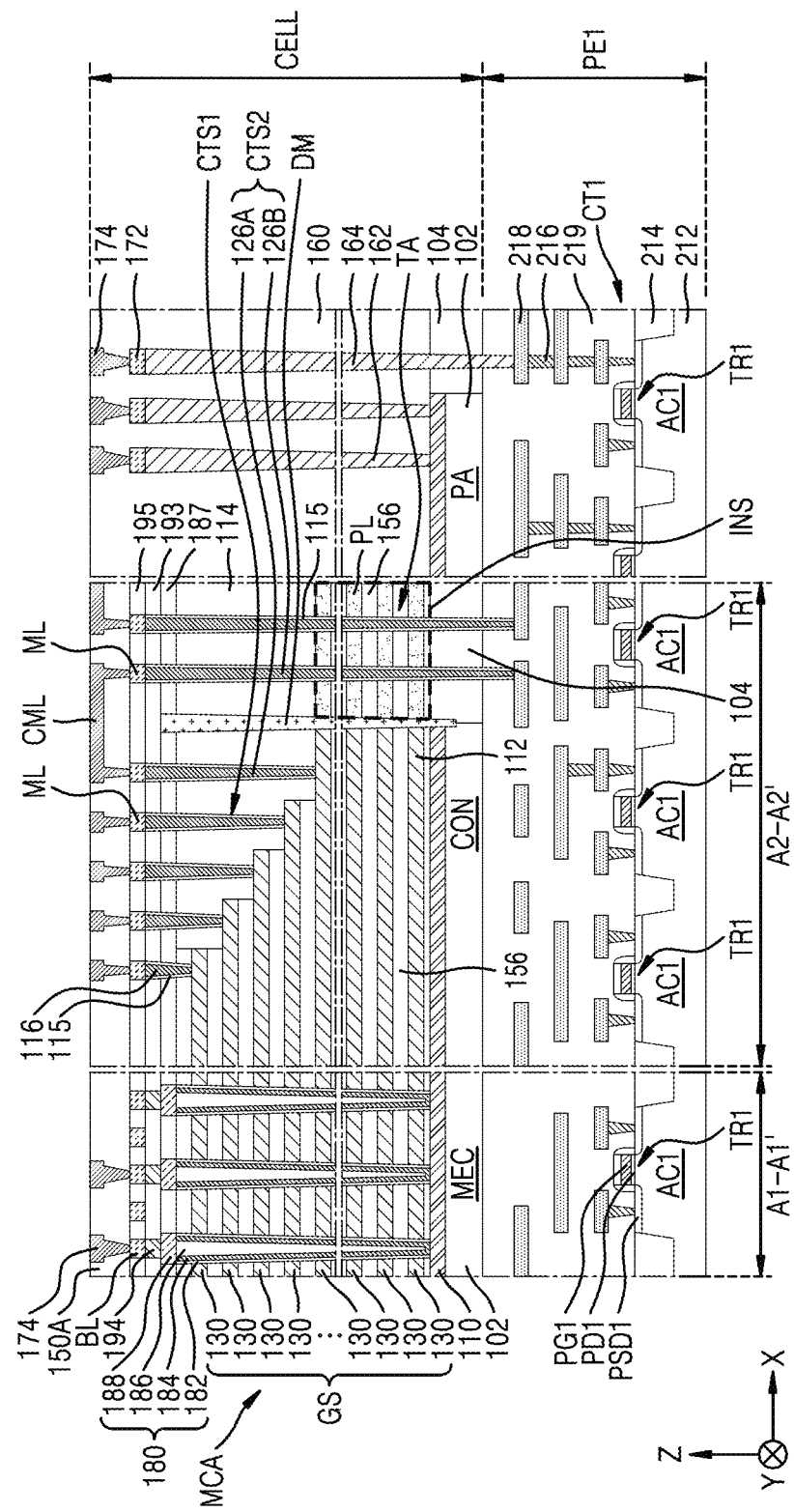

Referring to FIG. 15E, a plurality of first upper wiring layers 174 and a plurality of connection wiring layers CML may be formed on the resultant structure of FIG. 15D. The first contact plug 126A and the second contact plug 126B may be connected to each other by the connection wiring layer CML. The plurality of first upper wiring layers 174 and the plurality of connection wiring layers CML may be formed simultaneously. The plurality of connection wiring layers CML and the plurality of first upper wiring layers 174 may be insulated from each other by an interlayer insulating film 150A. Insulating films filing spaces between conductive patterns on the pad bonding region PA and the insulating plug 104 adjacent thereto may be left as interlayer insulating films 160.

Figure 15F:
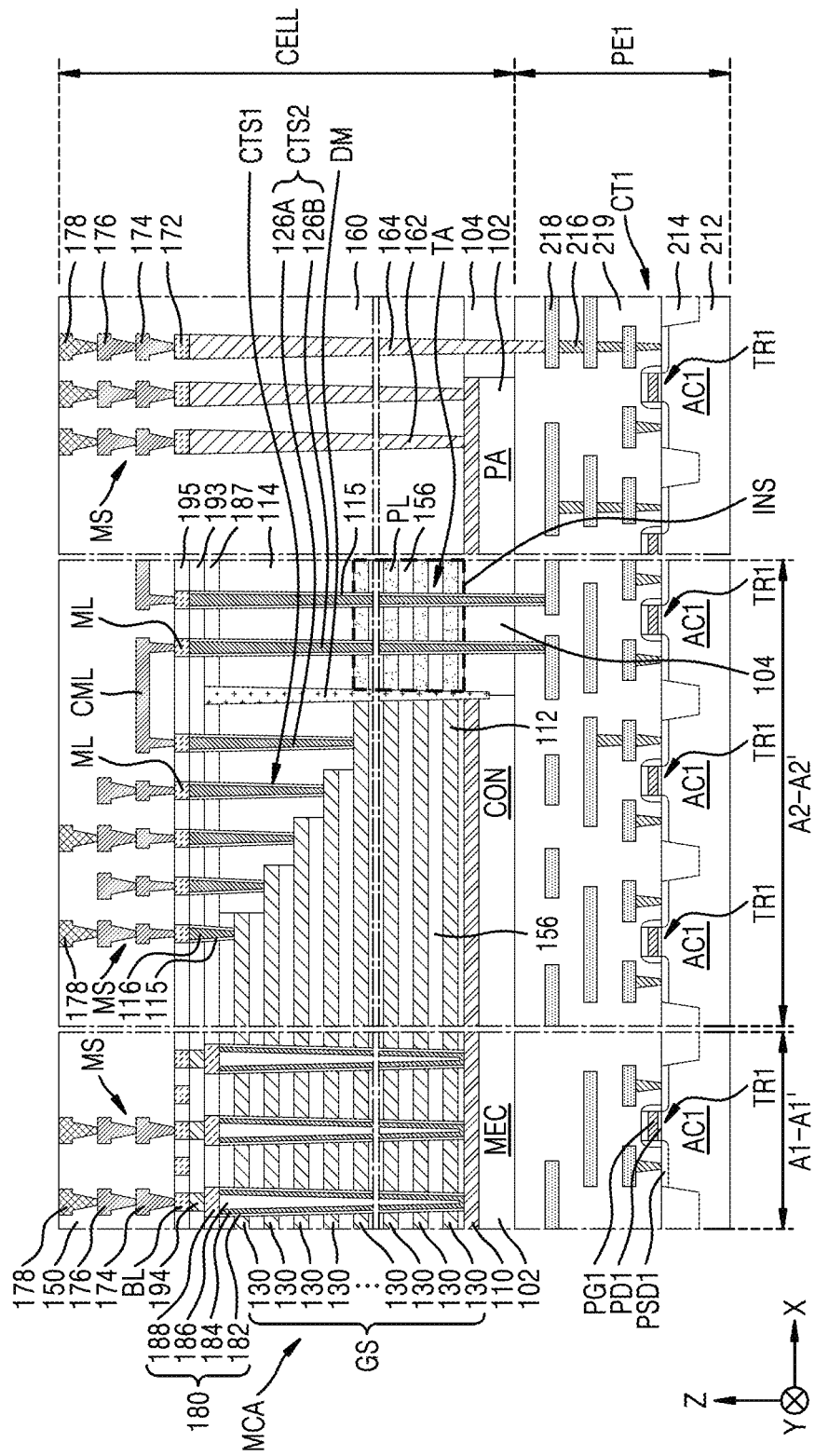

Referring to FIG. 15F, in the resultant structure of FIG. 15E, a plurality of second upper wiring layers 176 may be formed on the plurality of first upper wiring layers 174, and a plurality of first bonding metal pads 178 may be formed on the second upper wiring layers 176. The plurality of second upper wiring layers 176 may be insulated from each other by an interlayer insulating film 150, and the plurality of first bonding metal pads 178 may also be insulated from each other by the interlayer insulating film 150. Insulating films filling spaces between conductive patterns on the pad bonding region PA and the insulating plug 104 adjacent thereto may be left as interlayer insulating films 160.

Figure 15G:
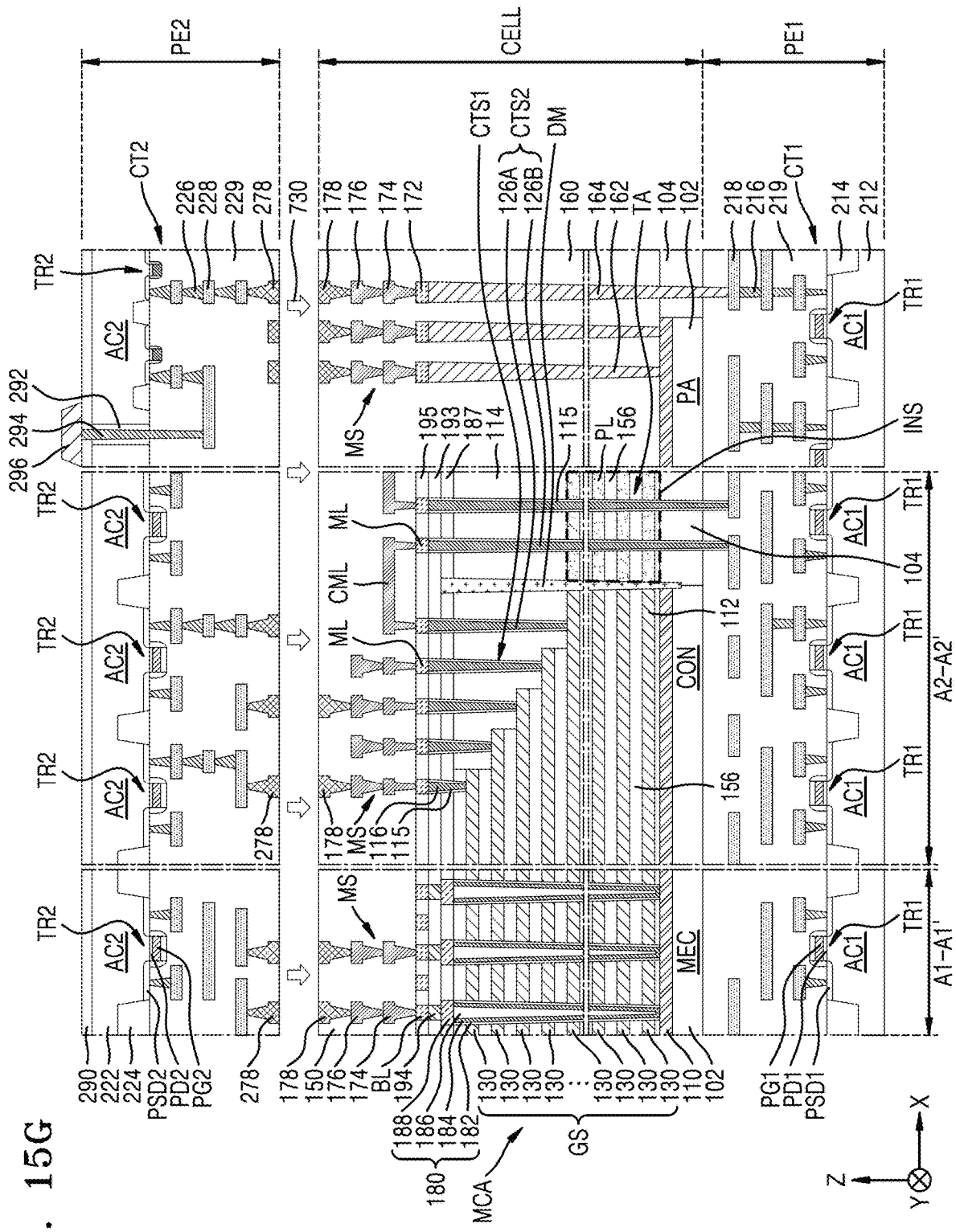

Referring to FIG. 15G, the second peripheral circuit region PE2 shown in FIG. 5B may be formed. The second peripheral circuit region PE2 may include a second peripheral circuit substrate 222 and a plurality of upper circuits CT2. The plurality of upper circuits CT2 may include a plurality of second transistors TR2, a plurality of upper conductive plugs 226, a plurality of upper conductive lines 228, and a plurality of second bonding metal pads 278.

The second peripheral circuit region PE2 may be arranged on a stack structure including the first peripheral circuit region PE1 and the cell region CELL, which is the resultant structure of FIG. 15F, to overlap the stack structure in the vertical direction (Z direction). Thereafter, the plurality of first bonding metal pads 178 included in the cell region CELL may be bonded to the plurality of second bonding metal pads 278 included in the second peripheral circuit region PE2.

In some example embodiments, the plurality of first bonding metal pads 178 may be directly bonded to the plurality of second bonding metal pads 278 without a separate adhesive layer by applying pressure to a structure including cell region CELL in the direction of arrow 730. For example, by applying pressure to the plurality of first bonding metal pads 178 and the plurality of second bonding metal pads 278 in a direction closer to each other in a state of facing each other, the plurality of first bonding metal pads 178 may be bonded to the plurality of second bonding metal pads 278 on an atomic level to form the bonding structures (refer to BS in FIG. 5B). In some example embodiments, before the plurality of first bonding metal pads 178 are bonded to the plurality of second bonding metal pads 278, to reinforce bonding strength between the plurality of first bonding metal pads 178 and the plurality of second bonding metal pads 278, a process of processing a surface of the cell region CELL at which the plurality of first bonding metal pads 178 are exposed and a surface of the second peripheral circuit region PE2 at which the plurality of second bonding metal pads 278 are exposed, with hydrogen plasma may be further performed. In some example embodiments, processes of forming some components included in the second peripheral circuit region PE2, for example, a process of forming a peripheral circuit insulating film 290 to cover a lower surface of the second peripheral circuit substrate 222, a process of forming insulating spacers 292 and an I/O contact plug 294, which pass through the second peripheral circuit substrate 222, and an I/O contact plug 294, and a process of forming an I/O pad 296 may be performed before the process of bonding the plurality of first bonding metal pads 178 to the plurality of second bonding metal pads 278. In some example embodiments, the process of forming the peripheral circuit insulating film 290, the process of forming the insulating spacers 292 and the I/O contact plug 294, and the process of forming the I/O pad 296 may be performed after the process of bonding the plurality of first bonding metal pads 178 to the plurality of second bonding metal pads 278.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although the method of manufacturing/fabricating the semiconductor device 100 shown in FIGS. 5A and 5B has been described with reference to FIGS. 15A to 15G, it will be understood that the semiconductor devices 400, 500 and 600 shown in FIGS. 7 to 11C and semiconductor devices having various structures may be manufactured/fabricated by applying various modifications and changes within the scope of inventive concepts.

While inventive concepts have been particularly shown and described with reference to some example embodiments thereof, it will be understood that various changes in form and details may be made therein without departing from the spirit and scope of the following claims.

What is claimed is:

1. A semiconductor device comprising:
    a first peripheral circuit region comprising a plurality of lower circuitries;
    a second peripheral circuit region apart from the first peripheral circuit region in a vertical direction, the second peripheral circuit region comprising a plurality of upper circuitries; and
    a cell region comprising a plurality of word lines, the cell region between the first peripheral circuit region and the second peripheral circuit region in the vertical direction, such that a lower surface of the cell region is on an upper surface of the first peripheral circuit region and lower surface of the second peripheral circuit region is on an upper surface of the cell region,
    wherein the plurality of word lines comprise a first word line connected to a first lower circuitry selected from the plurality of lower circuitries and a second word line connected to a first upper circuitry selected from the plurality of upper circuitries.

2. The semiconductor device of claim 1, wherein the cell region further comprises a first bonding metal pad,
    the second peripheral circuit region further comprises a second bonding metal pad, and
    the second word line connects to the first upper circuitry through a bonding structure comprising the first bonding metal pad and the second bonding metal pad.

3. The semiconductor device of claim 1, wherein the cell region further comprises a cell substrate between the plurality of word lines and the first peripheral circuit region, and
    the first word line connects to the first lower circuitry through a contact plug passing through the cell substrate.

4. The semiconductor device of claim 1, wherein the first peripheral circuit region comprises a plurality of first transistors,
    the second peripheral circuit region comprises a plurality of second transistors, and
    an operating voltage of each of the plurality of first transistors is different from an operating voltage of each of the plurality of second transistors.

5. The semiconductor device of claim 1, wherein the cell region further comprises a plurality of bit lines between the plurality of word lines and the second peripheral circuit region, and
    the plurality of bit lines comprise a first bit line connected to a second lower circuitry that is selected from the plurality of lower circuitries and a second bit line connected to a second upper circuitry that is selected from the plurality of upper circuitries.

6. The semiconductor device of claim 1, wherein the cell region comprises a first memory cell block and a second memory cell block, the first memory cell block including first structures, the second memory cell block including second structures different from the first structures, the first structures are apart from the second structures in a lateral direction,
    the first memory cell block comprises a first gate stack comprising at least one first gate line connected to at least one lower circuitry selected from the plurality of lower circuitries, and
    the second memory cell block comprises a second gate stack comprising at least one second gate line connected to at least one upper circuitry selected from the plurality of upper circuitries.

7. The semiconductor device of claim 1, wherein the cell region further comprises a plurality of memory cell blocks and a plurality of first bonding metal pads,
    each of plurality of the memory cell blocks comprises a gate stack comprising a plurality of gate lines,
    the second peripheral circuit region further comprises a plurality of second bonding metal pads,
    each of the plurality of gate lines included in a first memory cell block selected from the plurality of memory cell blocks connects to the first peripheral circuit region through a contact structure comprising a contact plug that passes through at least one of the plurality of gate lines, and
    each of the plurality of gate lines included in a second memory cell block selected from the plurality of memory cell blocks connects to the second peripheral circuit region through a plurality of bonding structures including the plurality of first bonding metal pads and the plurality of second bonding metal pads.

8. The semiconductor device of claim 1, wherein the cell region comprises:
    a conductive plate between the first peripheral circuit region and the plurality of word lines; and
    a common source line contact plug extending in the vertical direction from the conductive plate toward the second peripheral circuit region, the common source line contact plug connecting to one circuitry selected from the plurality of upper circuitries.

9. The semiconductor device of claim 1, wherein the cell region further comprises a connection contact plug extending in the vertical direction at a position apart from the plurality of word lines in a lateral direction,
    one end of the connection contact plug connects to one upper circuitry selected from the plurality of upper circuitries, and another end of the connection contact plug extends into the first peripheral circuit region and connects to one lower circuitry selected from the plurality of lower circuitries.

10. A semiconductor device comprising:
    a first peripheral circuit region comprising a first peripheral circuit substrate, a plurality of lower circuitries, and a plurality of lower conductive lines;
    a cell region comprising a cell substrate on the first peripheral circuit region, a plurality of gate lines on the cell substrate, a plurality of conductive pad regions connected to the plurality of gate lines, and a plurality of first bonding metal pads; and
    a second peripheral circuit region apart from the first peripheral circuit region with the cell region between the first peripheral circuit and the second peripheral circuit region, such that a lower surface of the cell region is on an upper surface of the first peripheral circuit region and lower surface of the second peripheral circuit region is on an upper surface of the cell region, the second peripheral circuit region comprising (A) a second peripheral circuit substrate, (B) a plurality of upper circuitries, (C) a plurality of upper conductive lines, and (D) a plurality of second bonding metal pads bonded to the plurality of first bonding metal pads, wherein the plurality of gate lines comprise (A) a first gate line connected to a first lower circuitry selected from the plurality of lower circuitries and (B) a second gate line connected to a first upper circuitry selected from the plurality of upper circuitries.

11. The semiconductor device of claim 10, wherein the cell region further comprises a contact plug extending in a vertical direction from a first conductive pad region toward the second peripheral circuit region, the first conductive pad region selected from the plurality of conductive pad regions, and the second gate line connects to a first upper conductive line selected from the plurality of upper conductive lines through the first conductive pad region, the contact plug, and one first bonding metal pad selected from the plurality of first bonding metal pads.

12. The semiconductor device of claim 10, wherein the cell region comprises a second contact structure passing through the cell substrate and extending into the first peripheral circuit region, and the first gate line connects to a first lower conductive line through the second contact structure, the first lower conductive line selected from the plurality of lower conductive lines.

13. The semiconductor device of claim 10, wherein the cell region comprises a first contact structure and a second contact structure, the first contact structure comprises a contact plug extending in a vertical direction from a first conductive pad region toward the second peripheral circuit region, the first conductive pad region selected from the plurality of conductive pad regions, and the second contact structure comprises a first contact plug and a second contact plug, the first contact plug extending in the vertical direction from a second conductive pad region toward the second peripheral circuit region, the second conductive pad region selected from the plurality of conductive pad regions, the second contact plug passing through at least one of the plurality of conductive pad regions and the cell substrate and extending in the vertical direction, the second contact plug connected to a first lower conductive line selected from the plurality of lower conductive lines, wherein the first gate line connects to a first lower conductive line through the second conductive pad region and the second contact structure, the first lower conductive line selected from the plurality of lower conductive lines, the second gate lines connect to a first upper conductive line through the first conductive pad region, the contact plug, and one first bonding metal pad selected from the plurality of first bonding metal pads, and the first upper conductive line is selected from the plurality of upper conductive lines.

14. The semiconductor device of claim 10, wherein the cell region further comprises a plurality of bit lines between the plurality of gate lines and the second peripheral circuit region, wherein the plurality of bit lines comprise, a first bit line connected to a second lower circuitry that is selected from the plurality of lower circuitries through a contact plug, the contact plug passing through the plurality of gate lines and the cell substrate and extending to the first peripheral circuit region; and a second bit line connected to a second upper circuitry selected from the plurality of upper circuitries through one first bonding metal pad selected from the plurality of first bonding metal pads.

15. The semiconductor device of claim 10, wherein the cell region further comprises:

a conductive plate between the cell substrate and the plurality of gate lines; and a common source line contact plug extending in a vertical direction from the conductive plate toward the second peripheral circuit region, wherein the common source line contact plug connects to one upper circuitry selected from the plurality of upper circuitries through one first bonding metal pad selected from the plurality of first bonding metal pads.

16. The semiconductor device of claim 10, wherein the cell region further comprises a connection contact plug extending in a vertical direction at a position apart in a lateral direction from the cell substrate, one end of the connection contact plug connects to one upper circuitry selected from the plurality of upper circuitries, and another end of the connection contact plug extends into the first peripheral circuit region and connects to one lower circuitry selected from the plurality of lower circuitries.

17. The semiconductor device of claim 10, wherein the cell region comprises a first memory cell block and a second memory cell block, having different structures from the first memory cell block and apart from the first memory cell block in a lateral direction, the first memory cell block comprises a first gate stack comprising the first gate line, and the second memory cell block comprises a second gate stack comprising the second gate line.

18. The semiconductor device of claim 10, wherein one of the first peripheral circuit region and the second peripheral circuit region comprises a plurality of low-voltage transistors having an operating voltage selected in a range of about 0.5 V to about 10 V, and the other one of the first peripheral circuit region and the second peripheral circuit region comprises a plurality of high-voltage transistors having an operating voltage higher than about 10 V.

19. An electronic system comprising:

a main substrate;

a semiconductor device on the main substrate; and a controller circuitry electrically connected to the semiconductor device on the main substrate, wherein the semiconductor device comprises, a first peripheral circuit region comprising a plurality of lower circuitries, a second peripheral circuit region apart from the first peripheral circuit region in a vertical direction, the second peripheral circuit region comprising a plurality of upper circuitries, and a cell region comprising a plurality of word lines, the cell region between the first peripheral circuit region and the second peripheral circuit region in the vertical direction, such that a lower surface of the cell region is on an upper surface of the first peripheral circuit region and lower surface of the second peripheral circuit region is on an upper surface of the cell region, wherein the plurality of word lines comprise a first word line connected to a first lower circuitry selected from the plurality of lower circuitries and a second word line connected to a first upper circuitry selected from the plurality of upper circuitries.

20. The electronic system of claim 19, wherein the main substrate further comprises wiring patterns configured to electrically connect the semiconductor device to the controller circuitry, and the semiconductor device includes,
- a plurality of first bonding metal pads in the cell region, and
- a plurality of second bonding metal pads in the second peripheral circuit region,
- wherein the second word line connects to the first upper circuitry through a bonding structure comprising the first bonding metal pad and the second bonding metal pad, and
- the first word line connects to the first lower circuitry through a contact plug arranged through at least one of the plurality of word lines.

* * * * *